United States Patent
Shimoji

(12) 
(10) Patent No.: US 6,228,715 B1
(45) Date of Patent: May 8, 2001

(54) SEMICONDUCTOR MEMORY DEVICE AND METHOD OF MANUFACTURING THEREOF

(75) Inventor: Noriyuki Shimoji, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/345,262

(22) Filed: Jun. 30, 1999

(30) Foreign Application Priority Data

Jul. 2, 1998 (JP) .................................................. 10-187707

(51) Int. Cl.$^7$ .............................................. H01L 21/8247
(52) U.S. Cl. ........................................... 438/264; 438/279
(58) Field of Search .................... 438/257–267, 438/279

(56) References Cited

U.S. PATENT DOCUMENTS

| | | |
|---|---|---|
| 5,120,671 | 6/1992 | Tang et al. . |
| 5,547,884 * | 8/1996 | Yamaguchi et al. . |
| 5,656,513 * | 8/1997 | Wang et al. .......................... 438/262 |
| 5,661,057 * | 8/1997 | Fujiwara .............................. 438/257 |
| 5,736,442 * | 4/1998 | Mori .................................... 438/257 |
| 5,989,959 * | 11/1999 | Araki .................................. 438/258 |

FOREIGN PATENT DOCUMENTS

| | | |
|---|---|---|
| 7-312395 | 11/1995 | (JP) . |
| 9-82924 | 3/1997 | (JP) . |

\* cited by examiner

*Primary Examiner*—Richard Booth
(74) *Attorney, Agent, or Firm*—Merchant & Gould P.C.

(57) ABSTRACT

It is an object of the present invention to provide a semiconductor memory device and a method of manufacturing thereof capable of increasing the integration thereof and having a high operation reliability. Anisotropic etching having a high selectivity to silicon oxide (SAS etching) is carried out by using a resist layer 56, a stacked gate 46, a thermal oxidation layer 58 as a mask. A field oxidation layer 44 located between low density sources LS is selectively removed by carrying out the SAS etching. A width w3 of the field oxidation layer 44 thus removed is not much less than a width w2 between the stacked gates 46 located adjacently because the thermal oxidation layer 58 formed on sides of the stacked gate 46 is thin in its thickness. A diffusion source wiring 55 formed by carrying out subsequent processes such as ion implantation and thermal diffusion can be formed in an appropriate width. A gate edge 59 of the stacked gate 46 can fully be protected with the thermal oxidation layer 58 even in the SAS etching while the thermal oxidation layer 58 is etched in its height during the SAS etching.

9 Claims, 29 Drawing Sheets

SEMICONDUCTOR MEMORY DEVICE AND METHOD OF MANUFACTURING THEREOF

CROSS-REFERENCE TO RELATED APPLICATION

The entire disclosure of Japanese Patent Application No. Hei 10-187707 filed on Jul. 2, 1998 including specification, claims, drawings and summary is incorporated herein by reference in its entirety.

BACKGROUND OF INVENTION

1. Field of the Invention

This invention relates to a semiconductor memory device and a method of manufacturing thereof, more specifically to a technology so called "Self Aligned Source" (hereinafter referred to as SAS technology) for higher integration of semiconductor memory devices.

2. Description of the Related Art

The SAS technology is known as a technique for realizing higher integration of nonvolatile semiconductor devices such as flash erasable programmable ROMs (hereinafter referred to as EPROM) and so on. A manufacturing method of memory arrays using the SAS technology will be described with reference to FIGS. 24A through 25B. As shown in FIG. 24A, field oxidation layers 4 for device separation are formed on a semiconductor substrate 2 so as to extend in a direction of X as longitudinal direction in stripe shape.

Next, stacked gates 6 (extending in a direction of Y as longitudinal direction in stripe shape) are formed at right angles to the field oxidation layers 4 as shown in FIG. 24B. Each of the stacked gates 6 has a structure that includes a gate oxidation layer 8, a floating gate 10, a layer 12 composed of an oxide film, a nitride film, and another oxide film (hereinafter referred to as ONO layer), and a control gate 14 formed in that order on a channel region CH defined in a memory cell (represented by memory cell MC shown in FIG. 25B).

Although, the gate oxidation layer 8, the floating gate 10, and the ONO layer 12 in the stacked gate 6, are formed so as to electrically isolate from the ones formed in another memory cell located adjacently, the control gate 14 is formed so as to electrically be connected to the memory cell with the one in the adjacent memory cell which forms the same column (a plurality of the memory cells located in a direction of Y, see FIG. 24B).

Then, a drain D and a low density source LS are formed under self-aligning manner using both the stacked gate 6 and the field oxidation layer 4. The drain D and the low density source LS are commonly used for two memory cells located adjacently, both form the same row (located in the direction of X).

Next, a resist layer 16 is formed so as to cover the drain D as depicted in FIG. 25A, and anisotropic etching having a high selectivity to silicon oxide is carried out by using both the resist layer 16 and the stacked gate 6 as a mask. The etching is generally referred to as SAS etching. A part of the field oxidation layer 4 lying between the adjacent memory cells which form the same column (in the direction of Y) is selectively removed by carrying out the SAS etching.

Highly concentrated arsenic (As) is ionically implanted to all over the substrate under the condition described above. In this way, the highly concentrated arsenic is implanted into both source formation regions commonly used for the adjacent memory cells which form the same row and regions connecting the source formation regions located in the column direction, in other words the regions are regions where the field oxidation layer 4 was removed therefrom as a result of the SAS etching.

Thereafter, a diffusion source wiring 15 connecting high density sources HS in the direction of Y is formed by carrying out thermal treatment to the substrate as depicted in FIG. 25B. In this way, the diffusion source wiring 15 can be formed under self-aligning manner using the stacked gates 6. These are the procedures carried out in SAS technology. Integration of semiconductor memory devices can be increased by using the SAS technology.

The SAS technology described above, however, has the following problems to be solved. Both an edge (a side) of the gate oxidation layer 8 and the surface of a source region S are unexpectedly etched in a certain extent during the SAS etching as shown in FIG. 26 which is illustrated under enlarged manner.

Unstable shape of the gate edge 19 which plays important roles for writing/erasing data into/from the memory cell MC, may arise undesirably when the problems exist as they are. In other words, voltages required for the data writing/erasing into/from the memory cell MC and duration for applying the voltages, possibly be varied in a large extent.

In order to solve these problems, an improved SAS technology shown in FIGS. 27A through 28B was proposed (see Japanese laid open publication No. Hei 7-312395). Both FIGS. 27A and 28A correspond to a section 27A shown in FIG. 25A, and these figures are concerned with the improved SAS technology. Both FIGS. 27B and 28B correspond to another section 27B shown in FIG. 25A, and these figures are also concerned with the improved SAS technology.

In the improved SAS technology, a low density source LS, a high density source HS, and a drain D are formed after forming thereof under self-aligning manner using the stacked gate 6. Thereafter, side walls 18 made of silicon oxides are formed on both sides of the stacked gate 6 before carrying out the SAS etching as shown in FIGS. 27A and 27B.

The side walls 18 are formed within the processes for manufacturing MOSFETs having Lightly Doped Drains (hereinafter referred to as LDD) which form peripheral circuits. In other words, the side walls 18 are formed by depositing silicon oxide by means of chemical vapor deposition (hereinafter referred to as CVD) or similar method, and then anisotropic etching is carried out thereto (carrying out etch-back processes). As a result, the side walls 18 becomes layers having a considerable thickness in the direction of X.

Thereafter, the SAS etching is carried out as shown in FIGS. 28A and 28B. The vicinity of the gate edge 19 is protected with the side walls 18 until completion of the SAS etching as shown in FIG. 28B even when the side walls 18 are etched during the SAS etching.

Then, highly concentrated arsenic (As) is ionically implanted to all over the substrate by using the resist layer 16, the stacked gate 6 and the remained side walls 18 as a mask, and then thermal treatment is carried out to the substrate. In this way, a diffusion source wiring 15 connecting high density sources HS in the direction of Y, is formed as depicted in FIG. 29 which shows a plan view of the vicinity thereof.

The improved SAS technology, however, has the following drawbacks to be resolved. Although, the gate edge 19 shown in FIG. 28B is protected from the SAS etching by employing the improved SAS technology, some portions of the diffusion source wiring 15 are undesirably narrowed in their width (to a width W1) as shown in FIG. 29.

The regions where ions of arsenic are implanted thereinto, are narrowed for a width equivalent to twice as much (approximately 3,000 to 4,000 angstroms) as the width of the side wall 18 thus remained (typically 1,500 to 2,000 angstroms) because the remained side walls 18 are used as a mask against the ion implantation of the highly concentrated arsenic.

In this way, electric resistance of the diffusion source wiring 15 is unexpectedly increased for the reason of the narrowed portions. Therefore, unstable operations may be observed when the semiconductor memory device is applied especially to memories which require a large amount of source current during the data storage. This is because source voltages among memory elements vary in a large extent due to voltage drop caused thereamong. The drawbacks described above can be resolved when a width w2 between the stacked gates 6 located adjacently is widen to a certain degree because the width w1 is proportional to the width w2. The integration of the memories, on the other hand, is decreased by widening the width w2. The integration of the memories is decreased to about a half of that when the width w2 is widen to approximately 3,000 through 4,000 angstroms in the memories using a design rule of 0.35 $\mu$m (3,500 angstroms).

SUMMARY OF THE INVENTION

It is an object of the present invention to overcome the above mentioned drawbacks on the semiconductor memory device associated with the prior arts, and to provide a semiconductor memory device and a method of manufacturing thereof capable of increasing the integration thereof and having a high operation reliability.

In accordance with characteristics of the present invention, there is provided a method of manufacturing a semiconductor device comprising a memory array portion, the memory array portion including a plurality of memory cells arranged in a matrix form, each of the memory cells having the following elements (A) through (C);

(A) a channel formation region of first conductive type defined in a semiconductor region provided on a semiconductor substrate;

(B) a first high density impurity region and a second high density impurity region both of a second conductive type, and both arranged so as to interpose the channel formation region; and (C) a stacked gate formed on the channel formation region including the following layers (C1) through (C4);
 (C1) a lower insulation layer formed on the channel formation region,
 (C2) a lower conductive layer disposed on the lower insulation layer,
 (C3) an upper insulation layer situated on the lower conductive layer, and
 (C4) an upper conductive layer located on the upper insulation layer, wherein the memory array portion has the following features that the upper conductive layer of the memory cells belong to the same column, is formed so as to connect the memory cells, and wherein the first high density impurity region and the second high density impurity region in each of the memory cells are respectively formed successively among the memory cells arranged adjacently in a row direction, and wherein the first high density impurity regions in the memory cells belong to two different columns adjacently arranged so as to interpose the first high density impurity region therebetween are formed successively in a column direction, and wherein the second high density impurity regions in the memory cells belong to two different columns adjacently arranged so as to interpose the second high density impurity region therebetween are electrically isolated with each other in the column direction by a device separating insulation layer, the manufacturing method, comprises the steps of:
 forming the device separating insulation layer extending in the row direction on the semiconductor region in stripe shape;
 disposing the stacked gate on both the semiconductor region and the device separating insulation layer formed in stripe shape in the column direction of the memory cells in stripe shape;
 forming an insulation thin layer substantially covering sides of the stacked gate;
 removing the device separating insulation layer under self-aligning manner by substantially using the stacked gate by means of selective etching; and
 forming the first high density impurity region under self-aligning manner by substantially using the stacked gate in the semiconductor region where includes the semiconductor region selectively removing a part of the device separating insulation layer.

In accordance with characteristics of the present invention, there is provided a semiconductor memory device comprises:

a memory array portion; the memory array portion including a plurality of memory cells arranged in a matrix form, each of the memory cells having the following elements (A) through (C);

(A) a channel formation region of first conductive type defined in a semiconductor region provided on a semiconductor substrate;

(B) a first high density impurity region and a second high density impurity region both of a second conductive type, and both arranged so as to interpose the channel formation region; and (C) a stacked gate formed on the channel formation region including the following layers (C1) through (C4), the stacked gate having an insulation thin layer which covers sides of the stacked gate, the insulation thin layer having a height such that the insulation thin layer substantially covers at least to an upper end of the lower insulation layer;
 (C1) a lower insulation layer formed on the channel formation region,
 (C2) a lower conductive layer disposed on the lower insulation layer,
 (C3) an upper insulation layer situated on the lower conductive layer, and
 (C4) an upper conductive layer located on the upper insulation layer, wherein the memory array portion has the following features that the upper conductive layer of the memory cells belong to the same column is formed so as to connect the memory cells, and wherein the first high density impurity region and the second high density impurity region in each of the memory cells are respectively formed successively among the memory cells arranged adjacently in a row direction, and wherein the first high density impurity regions in the memory cells belong to two different columns adjacently arranged so as to interpose the first high density impurity region therebetween are formed successively in a column direction, and wherein the second high density impurity regions in the memory cells belong to two different columns adjacently arranged so as to interpose the second high density impurity region therebetween are electrically isolated with each other in the column direction by a device separating insulation layer.

A phrase "a semiconductor region provided on a semiconductor substrate" used in claims include these three cases, in which the semiconductor region is provided so as to directly face the semiconductor substrate, in another case, the semiconductor region is provided thereon through one or more layers formed on the substrate, and in the other case, the substrate itself forms the semiconductor region.

While the novel features of the invention are set forth in a general manner, both as to organization and content, the invention will be better understood and appreciated, along with other objects and features thereof from the following detailed description taken in conjunction with the drawings.

DETAILED DESCRIPTION OF THE PREFERRED EMBODIMENT (1) First Embodiment

Figure 12:
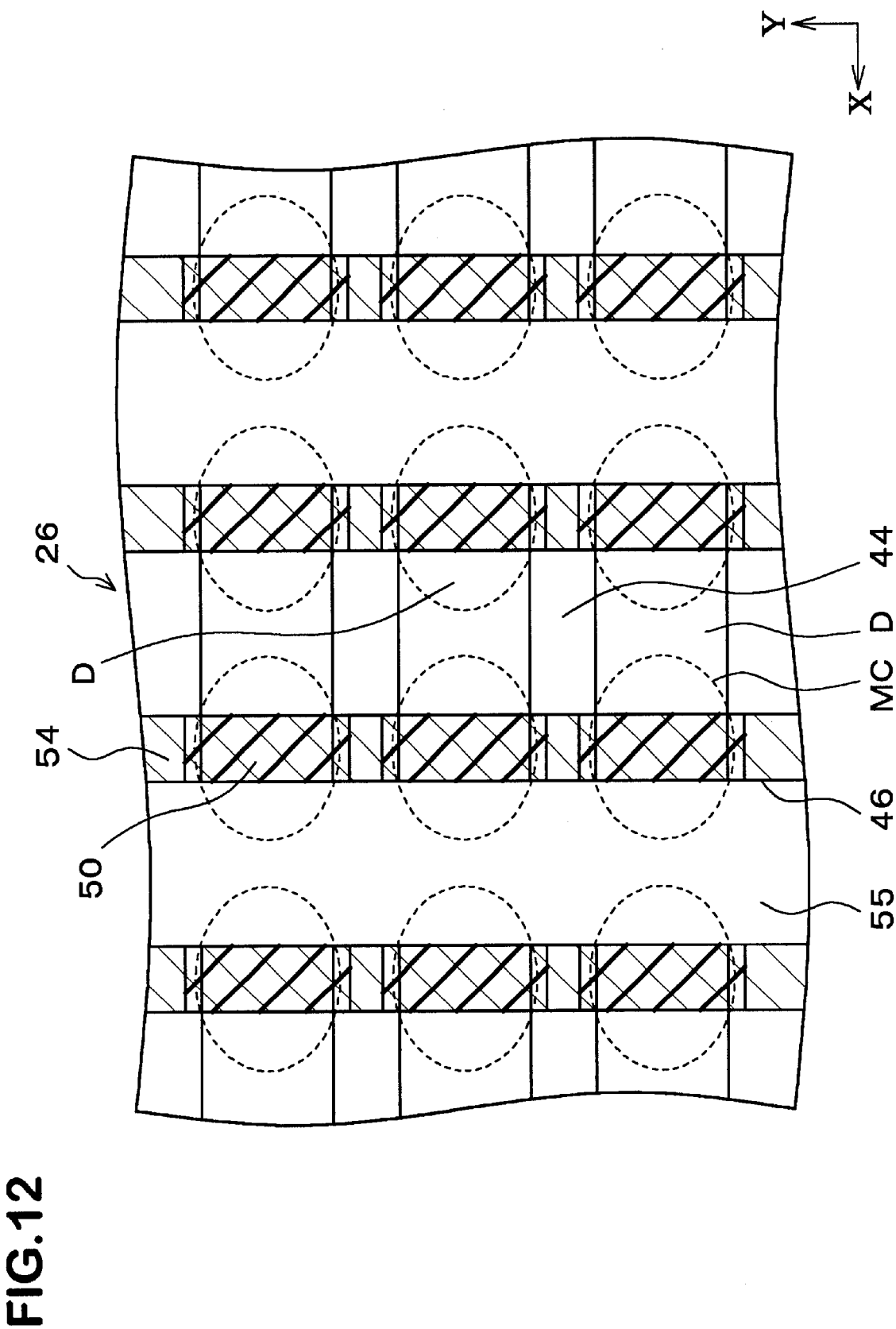
FIG. 12 is a plan view conceptually illustrating the memory array portion of the flash EPROM according to one embodiment of the present invention.

FIG. 12 is a plan view conceptually illustrating a memory array portion 26 of a flash EPROM according to one embodiment of the present invention. The flash type EPROM is a nonvolatile semiconductor memory device, and a plurality of memory cells MC (regions circled with dashed lines in FIG. 12) are arranged in a matrix form so as to across one another. A series of the memory cells extending in a direction of X is referred to as row and that extending in a direction of Y is referred to as column.

Figure 6:
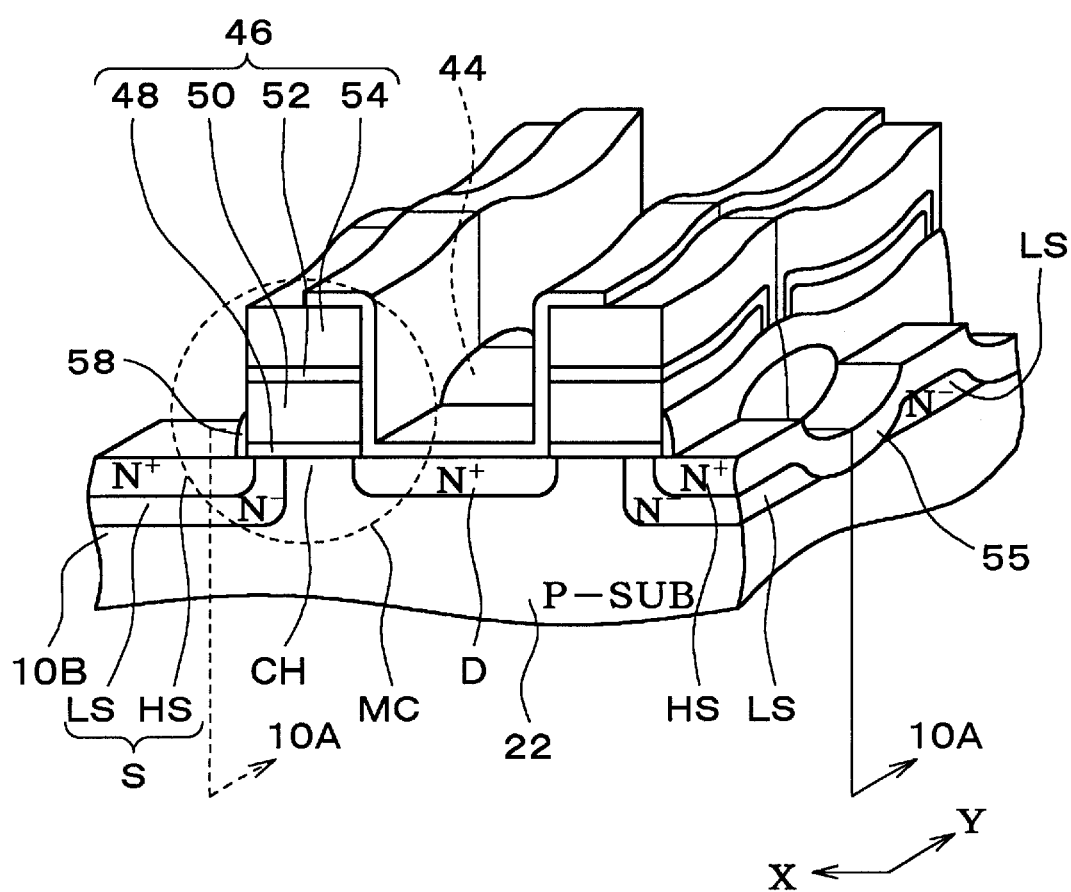
FIG. 6 is another perspective view showing the memory array portion 26 for describing the manufacturing processes of the flash EPROM according to one embodiment of the present invention.

FIG. 6 is a perspective view showing a part of the memory array portion 26. The memory cell MC comprises a channel region CH defined in a positive type (first conductive type) semiconductor substrate 22, a source S and a drain D (second high density impurity region) both of negative type (second conductive type), both of which are arranged so as to interpose the channel region CH therebetween, and a stacked gate 46 formed on the channel region CH.

The source S includes an N+ type high density source HS and an N− type low density source LS (low density impurity region) which is formed so as to surround the high density source HS.

The drains D and the sources S in the memory cells located adjacently which forms the same row (in the direction of X), are successively formed, and the successively formed drains D and the successively formed sources D are commonly used respectively. The high density source HS, formed in the source S of the memory cell, is connected with that located adjacently in the column direction (in the direction Y), thereby a diffusion source wiring 55 (first high density impurity region) is formed. The drains D formed in the memory cells each belong to different rows, are electrically isolated with one another by a field oxidation layer 44 (first isolation layer for device separation).

Each of the stacked gates 46 has a structure including a gate oxidation layer 48 (a lower insulation layer), a floating gate 50 (a lower conductive layer), an ONO layer 52 (an upper insulation layer), and a control gate 54 (an upper conductive layer) formed in that order. Although, the gate oxidation layer 48, the floating gate 50, and the ONO layer 52 in the stacked gate 46, are formed separately from the ones formed in another memory cell located adjacently, the control gate 54 is formed so as to connect the memory cell with the adjacent memory cell which forms the same column (a plurality of the memory cells located in the direction of Y). Regions hatched with thin lines which go up to right hand side in FIG. 12 show the control gates 54, and regions hatched with thick lines which come down to right hand side illustrate the floating gate 50.

A thermal oxidation layer 58 forming an isolation thin layer is formed on both sides of the stacked gates 46. Although, thickness of the thermal oxidation layer 58 is not limited to any specific number, it is preferred to form the thickness thereof in a range from approximately the same thickness as that of the gate oxidation layer 48 through about ten times of the gate oxidation layer 48. The probability of a current flow from the source S to the floating gate 50 through the thermal oxidation layer 58, that should be flow thereto through the gate oxidation layer 48, may be remarkably lowered, and the decrease of the diffusion source wiring 55 in width can be minimized when the thermal oxidation layer 58 is formed in the thickness described above. It is preferable to form the thermal oxidation layer 58, for example, in a range of 100 to 1,000 angstroms when the gate oxidation layer 48 is formed approximately 100 angstroms in thickness.

It is much preferred to form the thermal oxidation layer 58 within a range from approximately the same thickness as that of the gate oxidation layer 48 through about five times of the gate oxidation layer 48 (in a range of 100 to 500 angstroms in above example) if the thickness can easily be controlled. It is still preferred to form the thermal oxidation layer 58 within a range from approximately the same thickness as that of the gate oxidation layer 48 through about twice of the gate oxidation layer 48 (in a range of 100 to 200 angstroms in above example).

In other words, the thickness of the thermal oxidation layer 58 is the thinner, the better if it can be formed in a thickness that can ignore a current flow through the thermal oxidation layer 58 to the floating gate 50.

The thermal oxidation layer 58 remains so as to cover sides of the gate oxidation layer 48 even after the SAS etching described subsequently.

Next, the manufacturing method of the flash EPROM will be described herein. FIGS. 1 through 6 are perspective views for describing the manufacturing processes of the flash EPROM according to one embodiment of the present invention. FIGS. 7A through 10B are sectional views illustrating the main portions of the flash EPROM in each of the processes.

Figure 1:
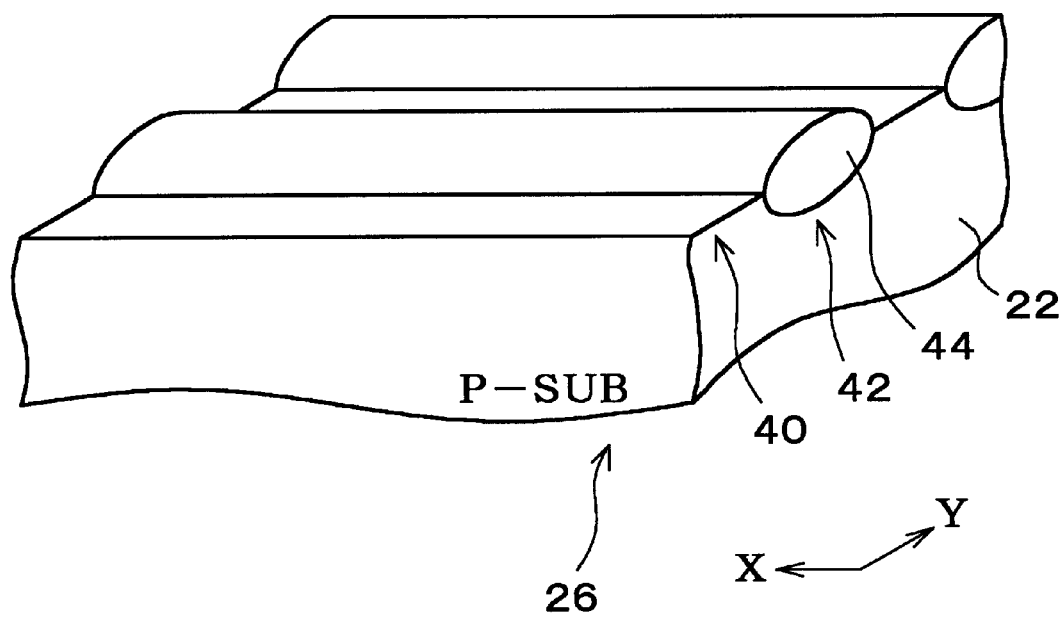
FIG. 1 is a perspective view showing a memory array portion 26 for describing manufacturing processes of a flash EPROM according to one embodiment of the present invention.

A semiconductor substrate 22 of positive type is prepared in the first step for manufacturing the flash EPROM as shown in FIG. 1. Then, field oxidation layers 44 are formed on device separation regions 42 of the memory array portion 26 by carrying out local oxidation method (LOCOS). The field oxidation layers 44 are formed so as to extend in the direction of X as longitudinal direction in stripe shape.

In this embodiment, the field oxidation layers 44 having 3,000 angstroms in thickness are formed by means of heating the substrate at approximately 1,000° C. under steam atmosphere.

Figure 2:
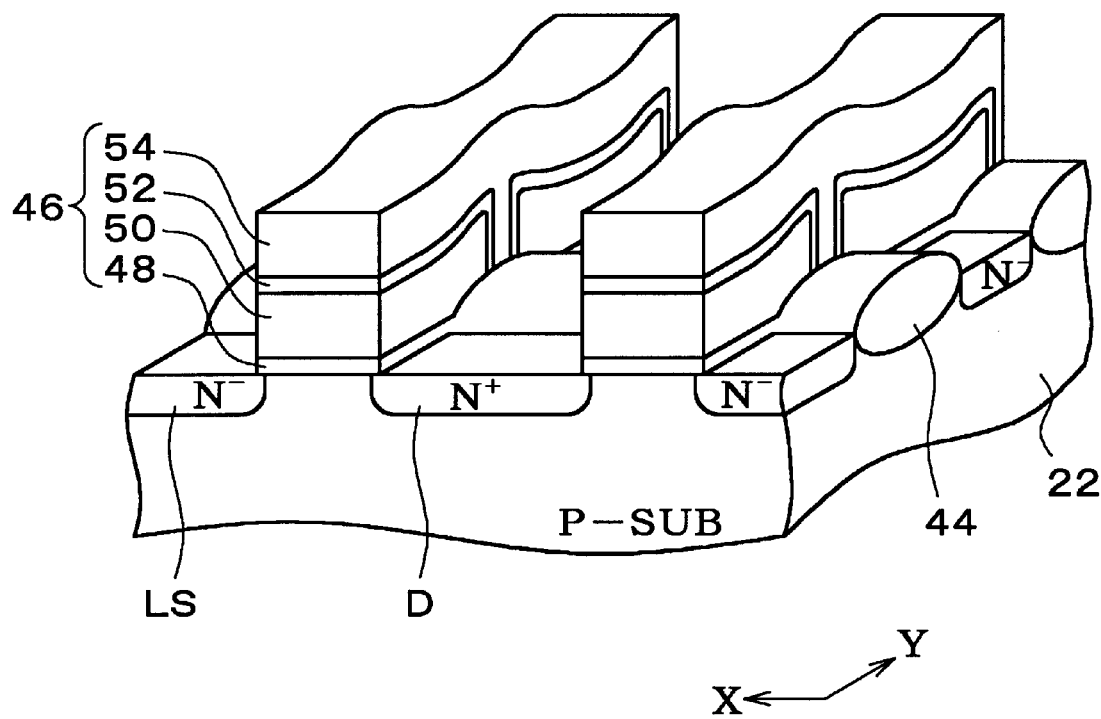
FIG. 2 is another perspective view showing the memory array portion 26 for describing the manufacturing processes of the flash EPROM according to one embodiment of the present invention.

Next, the stacked gates 46 (extending in the direction of Y as longitudinal direction in stripe shape) are formed at right angles to the field oxidation layers 44 in stripe shape as shown in FIG. 2. Each of the stacked gates 46 is formed by carrying out the following procedures.

At first, a thermal oxidation layer forming the gate oxidation layer 48 is formed on the surface of the device formation region 40 (see FIG. 1) where the semiconductor substrate 22 is exposed therefrom. The thermal oxidation layer is formed by carrying out thermal treatment to the substrate approximately at 900° C. under dry atmosphere in this embodiment.

A poly-silicon layer forming the floating gate 50 extending in the direction of X as longitudinal direction in stripe shape, is formed on the gate oxidation layer 48. In this embodiment, the poly-silicon layer is formed by means of CVD approximately at 620° C. Upon formation of the poly-silicon layer, phosphor used as an impurity is doped in the poly-silicon layer. Then, an ONO layer forming the ONO layer 52 is disposed on the poly-silicon layer so as to cover it.

Thereafter, a poly-silicon layer and a tungsten-silicide (WSi) layer, both forming the control gate 54, are formed on the ONO layer 52. The poly-silicon layer is formed by means of CVD approximately at 620° C. in this embodiment. Finally, the stacked gate 46 is formed by carrying out patterning of the poly-silicon layer, the tungsten-silicide (WSi) layer, the ONO layer, the poly-silicon layer extending in the direction of X as longitudinal direction in stripe shape, and the thermal oxidation layer.

In this embodiment, the layers composing the stacked layer 46 are formed respectively in thickness as stated below. That is, the gate oxidation layer 48, the floating gate 50, the ONO layer 52, and the control gate 54 are respectively formed approximately in 100 angstroms, about 1,000 angstroms, approximately 200 angstroms, and about 3,000 angstroms (within the control gate, thickness of the tungsten-silicide layer is approximately 1,500 angstroms).

Then, a low density source LS of $N^-$ type and a drain D of $N^+$ type are formed under self-aligning manner using the stacked gate 46. In order to form the low density source LS, low concentrated phosphor (P) is implanted into a region where to be the low density source LS after covering a region where to be the drain D with a resist layer (not shown). For forming the drain D, highly concentrated arsenic (As) is implanted into the region where to be the drain D after covering the region where to be the low density source LS with a resist layer (not shown). Thereafter, both the low density source LS and the drain D are formed through annealing (thermal treatment) process.

As described earlier, the drains D and the low density source LS in the memory cells located adjacently which forms the same row (in the direction of X), are successively formed, and the successively formed drains D and the successively formed low density sources LS are commonly used respectively. LDD regions of an N channel type Metal Oxide Field Effect Transistor (MOSFET) and a P channel type MOSFET (not shown), forming peripheral circuits are formed before or after the process for forming the low density source LS and the drain D.

Figure 3:
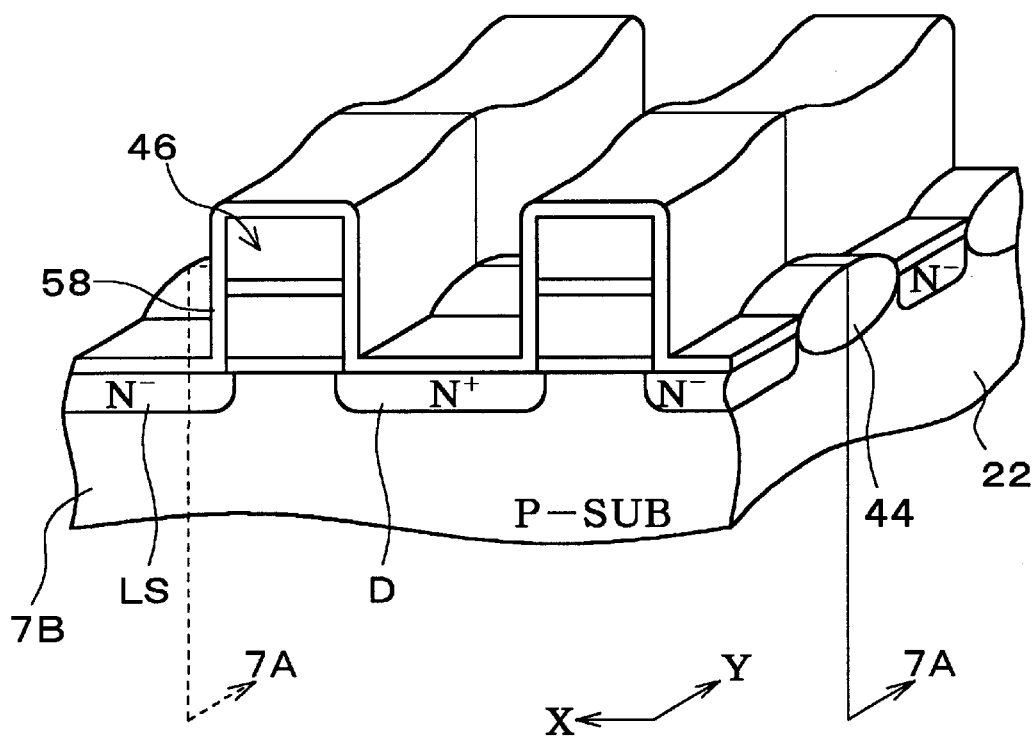
FIG. 3 is far another perspective view showing the memory array portion 26 for describing the manufacturing processes of the flash EPROM according to one embodiment the present invention.

Next, the thermal oxidation layer 58 is formed on the upper surface and sides of the stacked gate 46 by carrying out thermal oxidation as depicted in FIG. 3. The use of the thermal oxidation layer 58 as the insulation thin layer provides advantages of an easy control of its thickness as well as a high insulation capability because of its dense structure.

The thermal oxidation layer 58 is formed approximately in 200 angstroms, in other words, its thickness is twice as much as that of the gate oxidation layer 48 in this embodiment.

In this way, the probability of a current flow from the source S to the floating gate 50 through the thermal oxidation layer 58, that should be flow thereto through the gate oxidation layer 48, may be remarkably lowered, and the decrease of the diffusion source wiring 55 in width can be minimized. In other words, the decrease of the diffusion source wiring 55 in width can be minimized while maintaining insulation of the thermal oxidation layer 58.

Figure 7A:
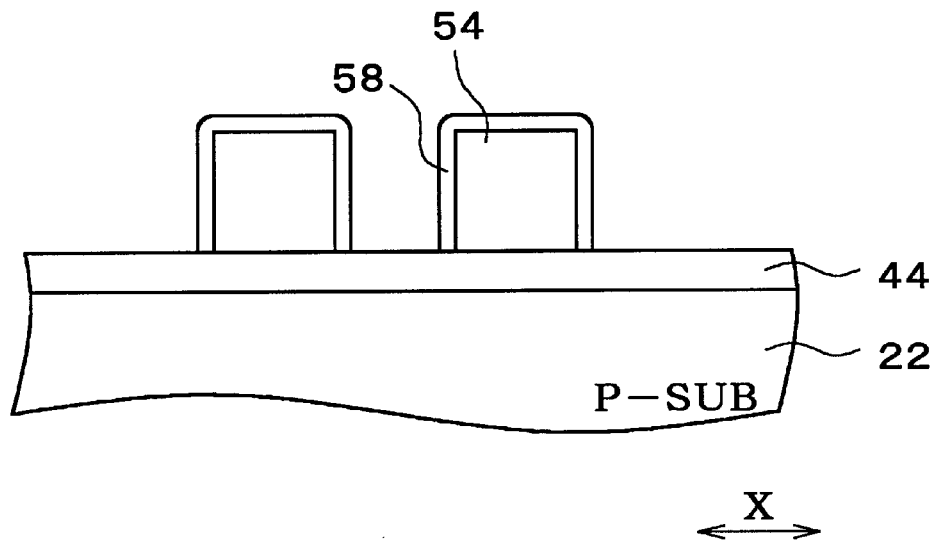
FIG. 7A is a sectional view illustrating a section 7A depicted in FIG. 3.
Figure 7B:
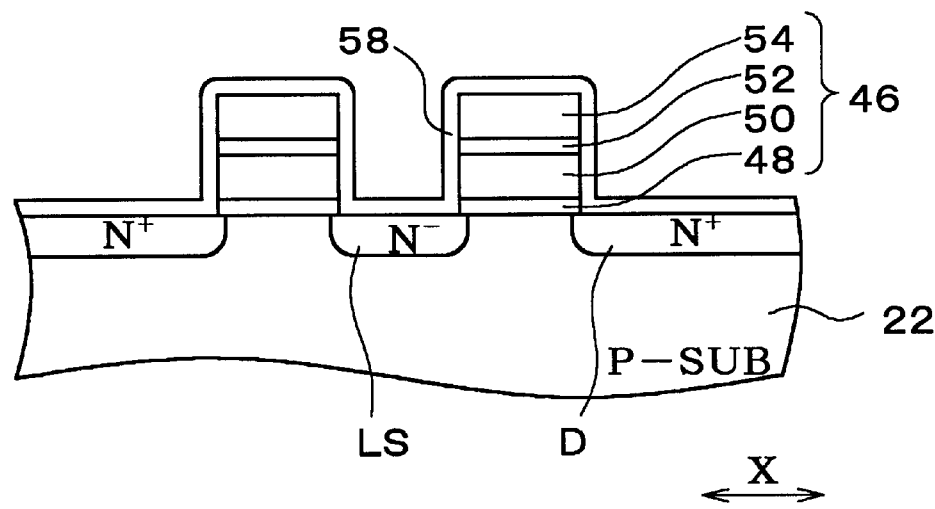
FIG. 7B is another sectional view illustrating a section 7B depicted in FIG. 3.
Figure 8A:
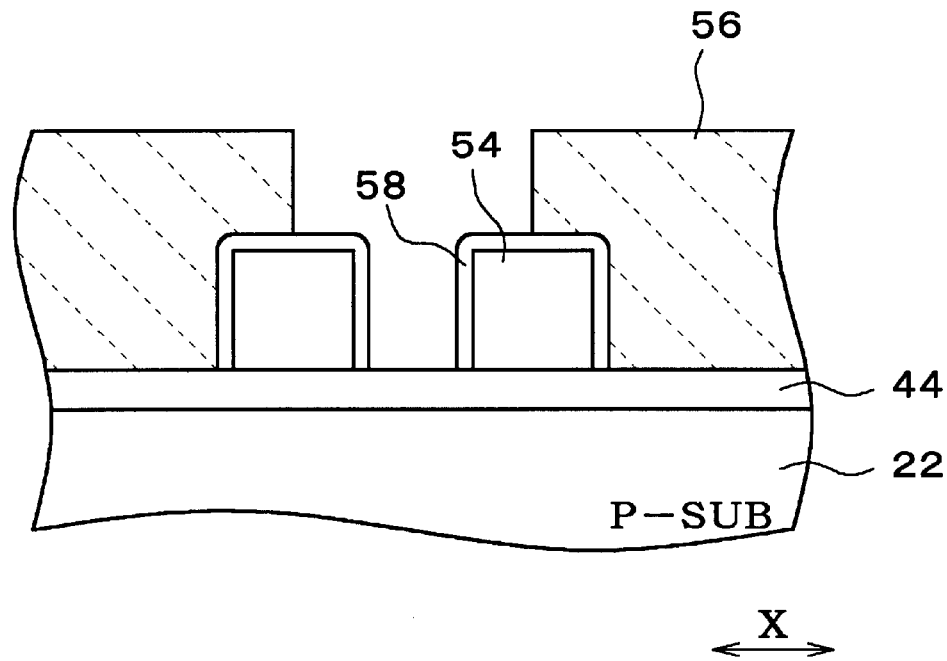
FIG. 8A is a sectional view illustrating a section 8A depicted in FIG. 4.
Figure 8B:
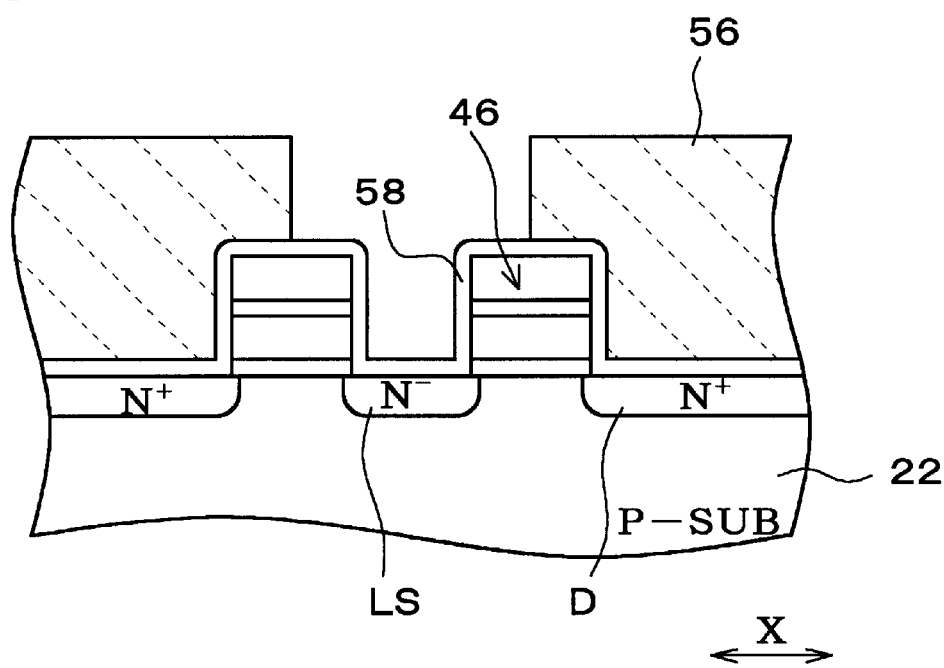
FIG. 8B is another sectional view illustrating a section 8B depicted in FIG. 4.

Sections 7A and 7B both depicted in FIG. 3 are respectively illustrated in FIGS. 7A and 7B. The thermal oxidation layer 58 is formed so as to cover the upper surface and the sides of the stacked gate 46 as shown in FIG. 7B. The gate oxidation layer 58 is also formed on the surface where the semiconductor substrate 22 is exposed therefrom.

Figure 4:
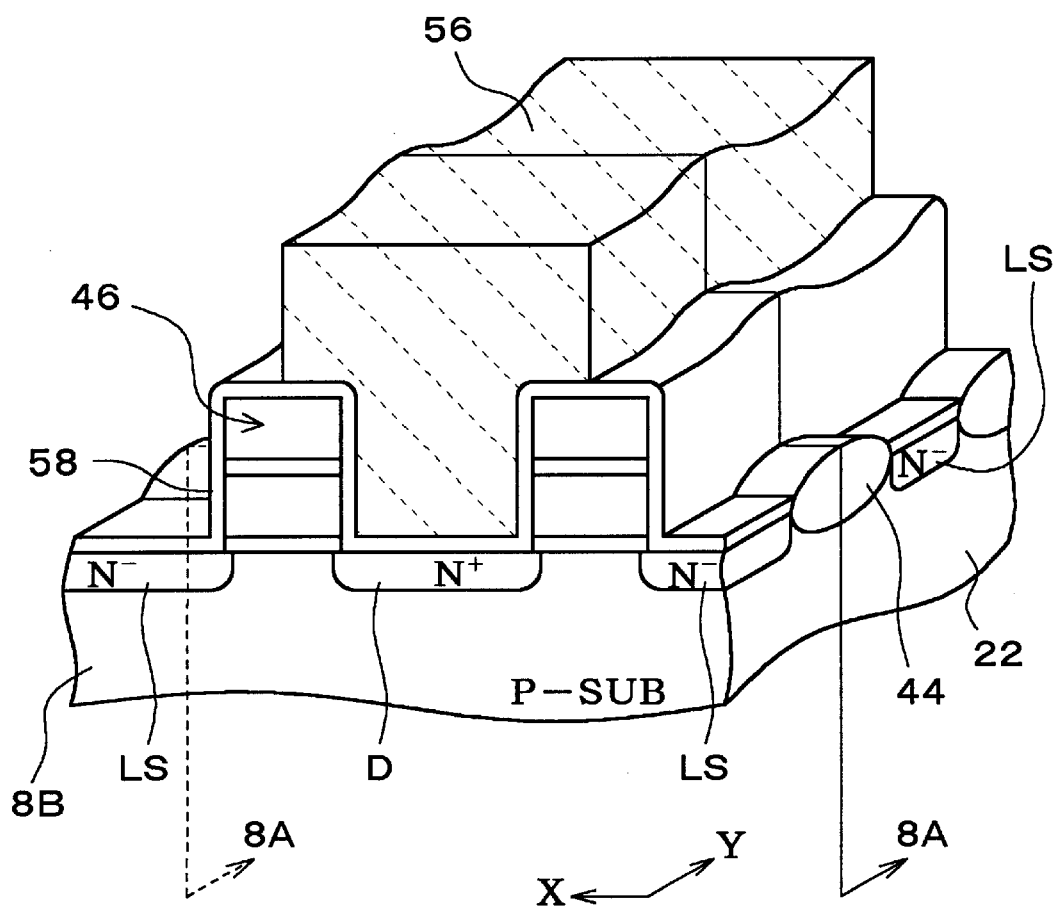
FIG. 4 is still another perspective view showing the memory array portion 26 for describing the manufacturing processes of the flash EPROM according to one embodiment of the present invention.

Then, a resist layer 56 extending in the direction of Y as longitudinal direction in stripe shape, is disposed so as to cover the drain D and a part of the stacked gates 46 as depicted in FIG. 4. Sections 8A and 8B both depicted in FIG. 4 are respectively illustrated in FIGS. 8A and 8B.

Figure 5:
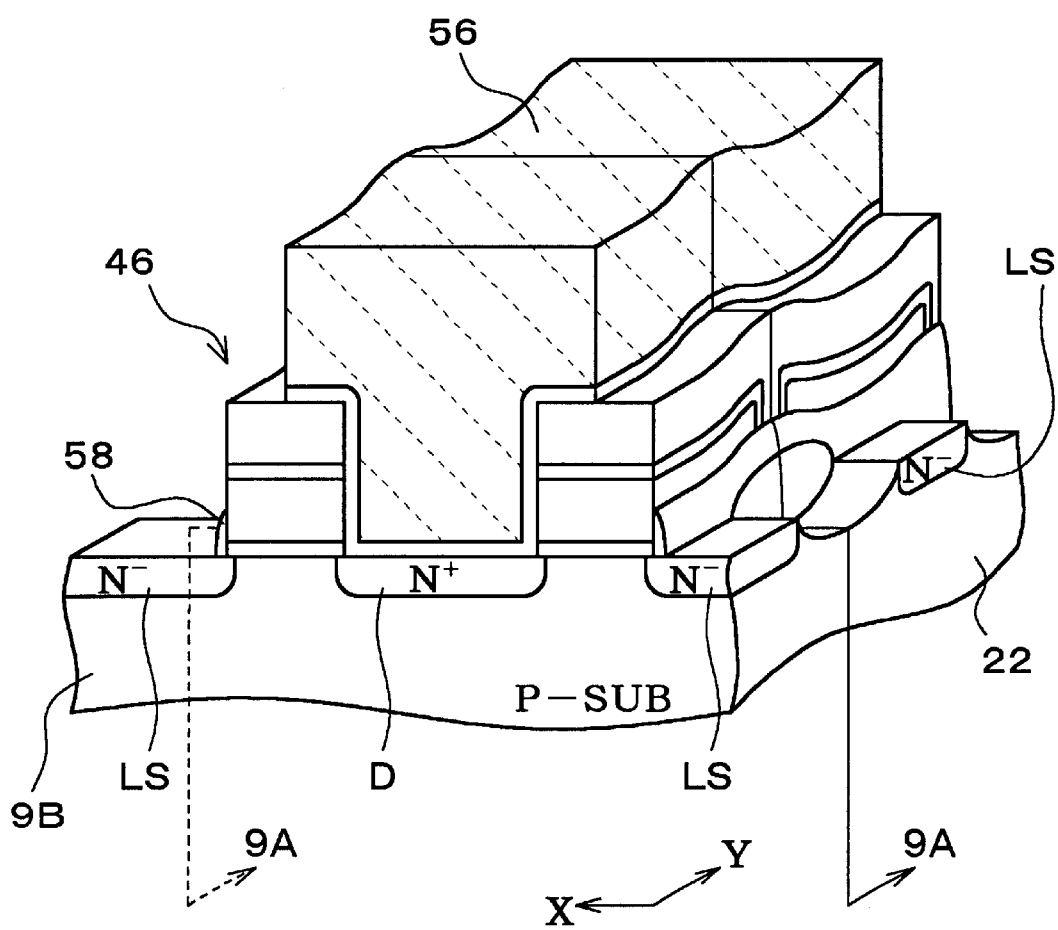
FIG. 5 is yet another perspective view showing the memory array portion 26 for describing the manufacturing processes of the flash EPROM according to one embodiment of the present invention.

Thereafter, SAS etching having a high selectivity to silicon oxide is carried out by using the resist layer 56, the stacked gate 46, and the remained thermal oxidation layer 58 as a mask. Sections 9A and 9B both depicted in FIG. 5 are respectively illustrated in FIGS. 9A and 9B.

Figure 9A:
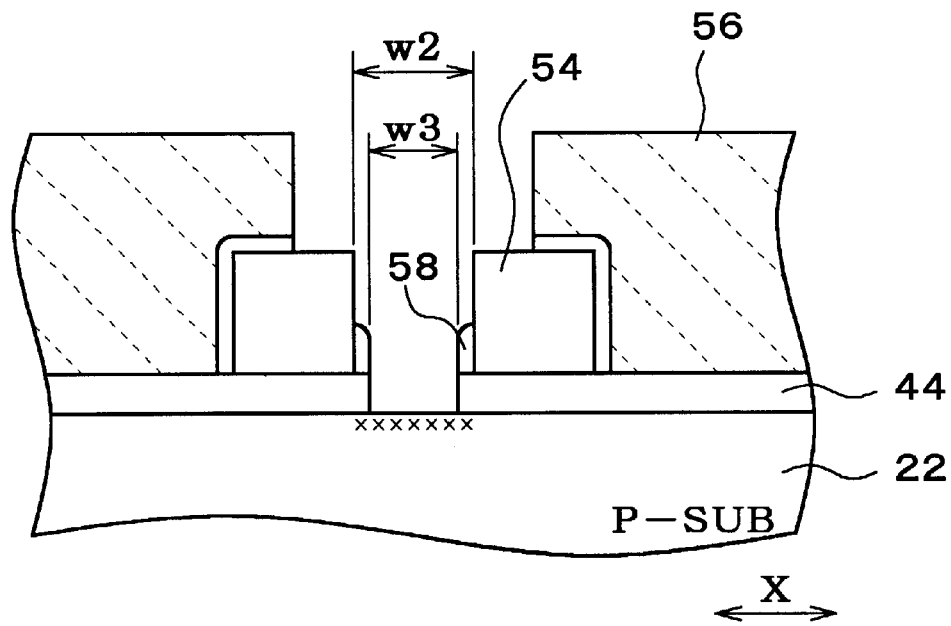
FIG. 9A is a sectional view illustrating a section 9A depicted in FIG. 5.

The field oxidation layer 44 located between the low density sources LS (see FIG. 4) is selectively removed by carrying out the SAS etching as depicted in FIG. 9A. A width w3 of the field oxidation layer 44 thus removed is not much less than the width w2 between the stacked gates located adjacently as shown in FIG. 9A because the thermal oxidation layer 58 formed on the sides of the stacked gate 46 is thin in its thickness.

Figure 9B:
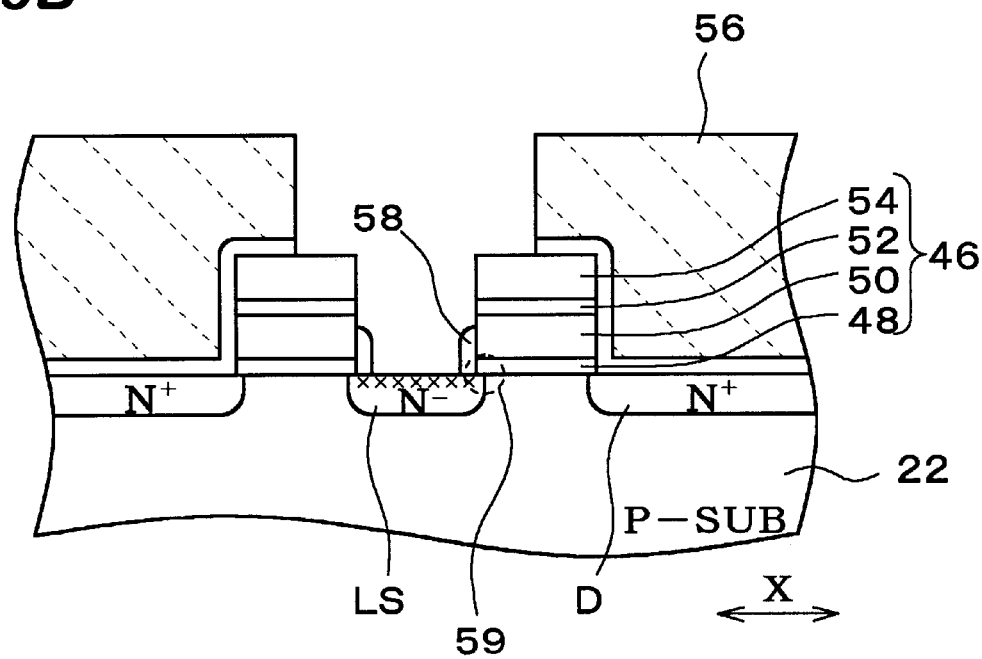
FIG. 9B is another sectional view illustrating a section 9B depicted in FIG. 5.

The thermal oxidation layer 58 exposed similar to the field oxidation layer 44, is etched simultaneous with the field oxidation layer 44 in its height during the SAS etching, so that its height becomes short as depicted in FIG. 9B. The thermal oxidation layer 58, however, is not etched too much in directions at right angles (such as in the directions of X and Y in the drawings) to its height. On the other hand, thickness of the stacked gate 46 (approximately in 4,300 angstroms) is much thicker than that of the field oxidation layer (in about 3,000 angstroms) as described earlier.

In this way, the thermal oxidation layer 58 remains on the sides of the stacked gate 46 in a certain height and a certain thickness even when removal of the field oxidation layer 44 is completed. In other words, a gate edge 59 of the stacked gate 46 is covered with the thermal oxidation layer 58 until completion of the SAS etching.

Upon completion of the SAS etching, highly concentrated arsenic (As) is ionically implanted to all over the substrate using the resist layer 56, the stacked gate 46, and the remained thermal oxidation layer 58 as a mask. A dimension of the thermal oxidation layer 58 in the direction of X (that is, thickness of it) not cause serious problems similar to the case for carrying out the SAS etching because the thermal oxidation layer 58 formed on sides of the stacked gate 46 is thin in its thickness as described earlier.

The regions where the highly concentrated arsenic being implanted therein are illustrated with "X" in FIGS. 9A and 9B. In other words, as shown in FIG. 5, the highly concentrated arsenic is implanted to the low density sources LS and a region connecting the low density sources LS in the direction of Y, that is, the region where part of the field oxidation layer 44 is removed.

Figure 10A:
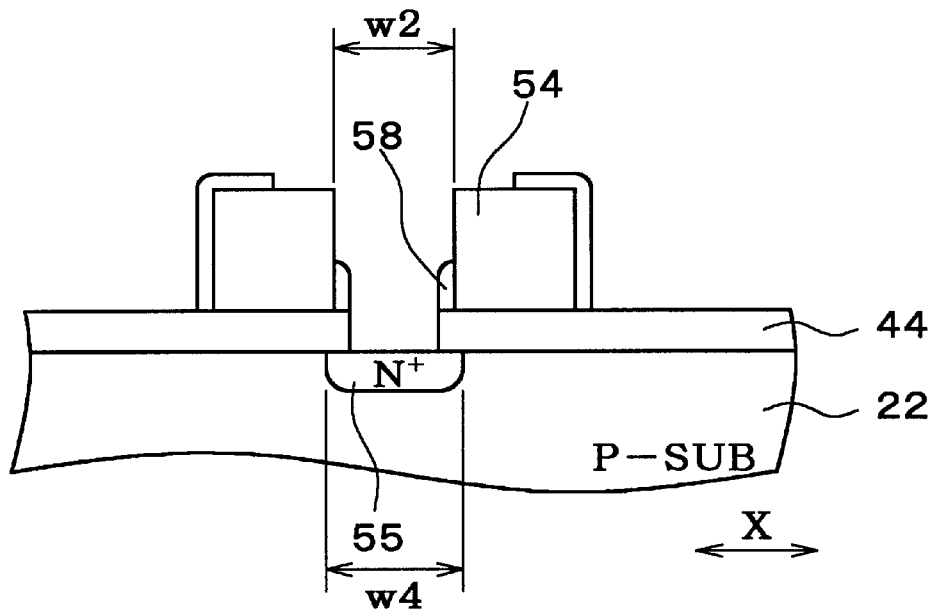
FIG. 10A is a sectional view illustrating a section 10A depicted in FIG. 6.
Figure 10B:
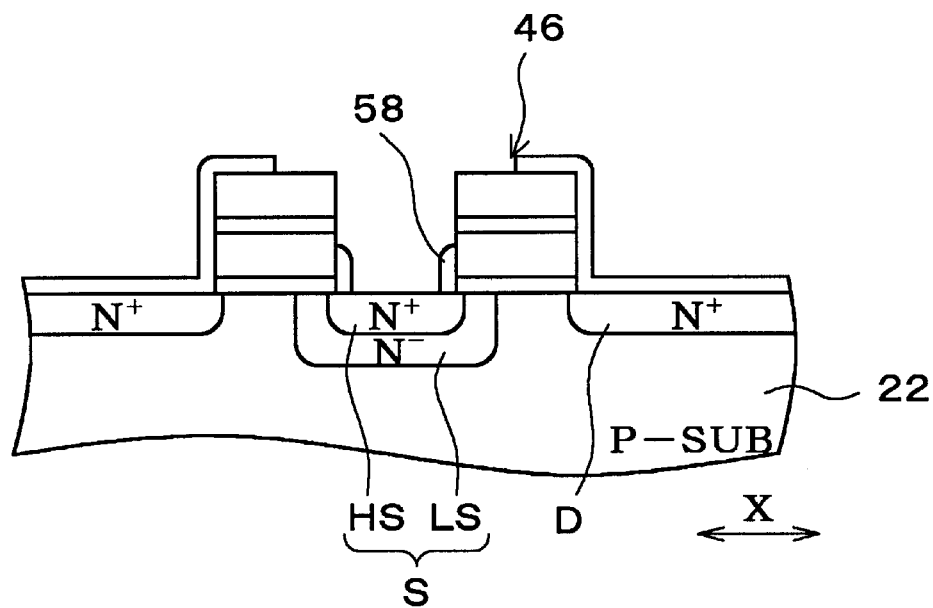
FIG. 10B is another sectional view illustrating a section 10B depicted in FIG. 10.
Figure 11:
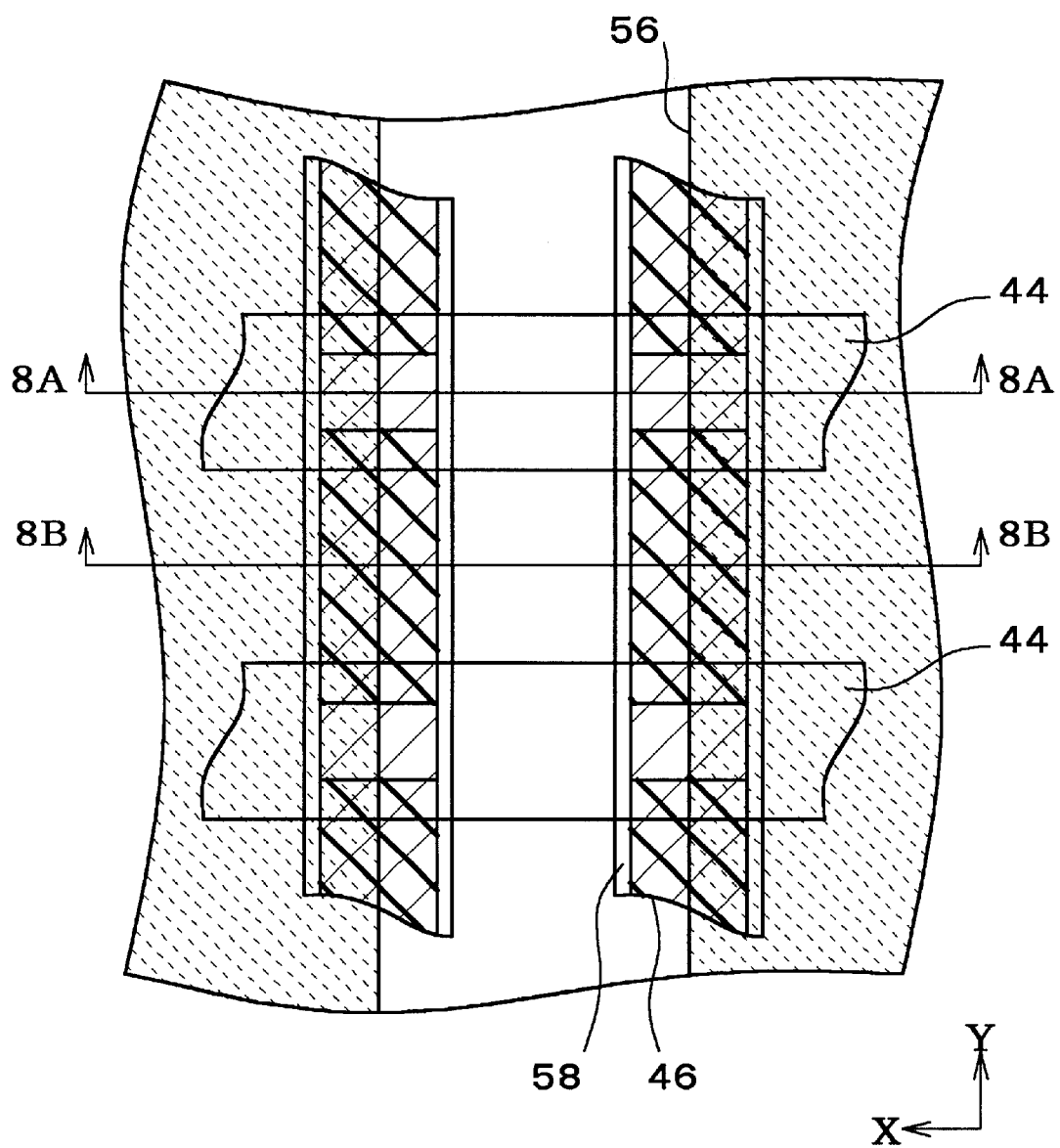
FIG. 11 is a plan view conceptually illustrating the structures formed in the memory array portion when the manufacturing process is in a step shown in FIG. 4.

A plurality of high density sources HS in the memory cells and the diffusion source wiring 55 formed by connecting the high density sources HS in the direction of Y, are formed by removing the resist layer 56, and then carrying out thermal treatment as depicted in FIG. 6. In this way, the diffusion source wiring 55 can be formed under self-aligning manner by substantially using the stacked gate 46. Sections 10A and 10B both depicted in FIG. 6 are respectively illustrated in FIGS. 10A and 10B. As shown in FIG. 10A, it can be appreciated that a width w4 of the diffusion source wiring 55 is almost equivalent to or wider than that of the width w2 between the stacked gates 46 located adjacently.

Thereafter, side walls are formed on sides of the gates in the N channel type MOSFET and the P channel type MOSFET (not shown) both forming the peripheral circuits. An $N^+$ type source/drain and a $P^+$ type source/drain are formed respectively in the N channel type MOSFET and the P channel type MOSFET by using the gates and the side walls as a mask.

Other side walls (not shown) are formed on the sides of the stacked gate 46 simultaneously with the formation of the side walls on the sides of the gates in the N channel type MOSFET and the P channel type MOSFET both forming the peripheral circuits.

The flash EPROM is fabricated by carrying out further processes, such as inter-layer formation process, contact formation process, aluminum wiring formation process, passivation layer formation process.

As described earlier, the feature of this embodiment is that, the thermal oxidation layer 58 which covers the sides of the stacked gates 46 is formed, and the field oxidation layer 44 is removed by carrying out selective etching under self-aligning manner by substantially using the stacked gate 46. Further feature of this embodiment is that the diffusion source wiring 55 formed by connecting the high density sources HS in the direction of Y, is formed in the semiconductor substrate 22 including the semiconductor region where the field oxidation layer 44 is removed under self-aligning manner by substantially using the stacked gate 46.

In this way, the gate edge 59 including the sides of the gate oxidation layer 48 (see FIG. 9B) never be etched because the edge 59 is covered with the thermal oxidation layer 58. As a result, the reliability for writing/erasing data into/from the memory cell can be increased.

Further, the decrease of the diffusion source wiring 55 in width can be restricted when the wiring 55 is formed by using both the stacked gate 46 and the thermal oxidation layer 58 as a mask because the oxidation layer 58 is formed thin in thickness. In this way, a predetermined width of the diffusion source wiring 55 can be maintained without widening the width between the stacked gates 46 located adjacently. As a result, unexpected increase of electric resistance in the diffusion source wiring 55 formed consecutively in the column direction may be avoided without sacrificing the integration of the semiconductor memory.

In other words, it is possible to provide a flash EPROM capable of increasing the integration thereof and having a high operation reliability.

Although, the thermal oxidation layer 58 is used as the insulation thin layer in this embodiment, other thin layer(s) made mainly of silicon oxide such as a silicon oxidation layer formed by means of CVD method can be used as the insulation thin layer. The silicon oxidation layer can easily be formed at a low temperature by using CVD method.

Though, a thin layer made mainly of silicon oxide is used as the insulation thin layer in this embodiment, the material of the insulation thin layer is not limited to that. Another thin layer made mainly of silicon nitride may also be used as the insulation thin layer.

(2) Second Embodiment

Figure 13:
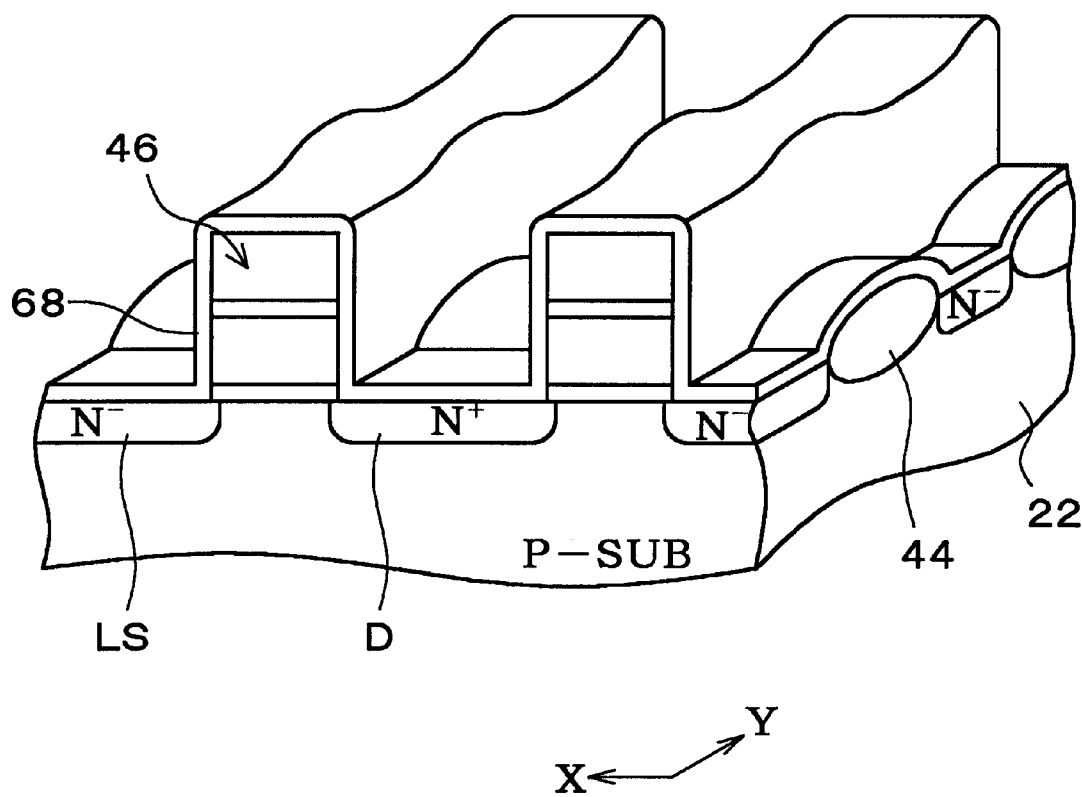
FIG. 13 is a perspective view showing the memory array portion 26 for describing manufacturing processes of the flash EPROM according to another embodiment of the present invention.

Another manufacturing method of a flash EPROM using a thin layer made mainly of silicon nitride instead of the thermal oxidation layer 58 will be described with reference to FIG. 13 through FIG. 16. All the processes carried out until completion of the stacked gate 46 are the same as the method described in earlier embodiment (see FIGS. 1 and 2). Upon completion of the stacked gate 46, a silicon nitride layer 68 is formed as the insulation thin layer as depicted in FIG. 13. The silicon nitride layer 68 is disposed by accumulating silicon nitride as thin films by means of CVD method.

In this way, the silicon nitride layer 68 disposed as thin films, is located not only on the sides of the stacked gates 46, but also on the upper surface thereof, on the surface where the semiconductor substrate 22 is exposed therefrom, and on the field oxidation layer 44. Although, the silicon nitride layer 68 is disposed 200 angstroms in thickness, the thickness thereof is not limited to the specific number, similar to that described in the earlier embodiments.

Figure 14:
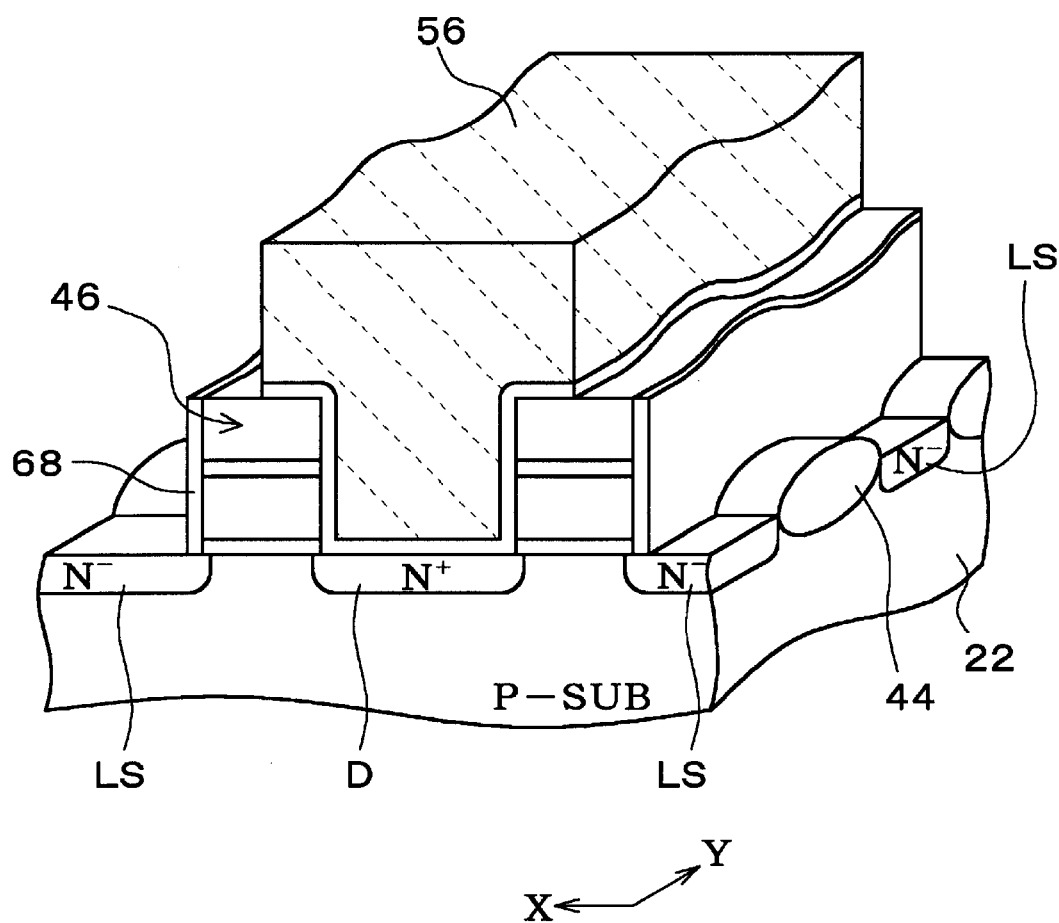
FIG. 14 is another perspective view showing the memory array portion 26 for describing the manufacturing processes of the flash EPROM according to another embodiment of the present invention.

Next, a resist layer 56 extending in the direction of Y as longitudinal direction in stripe shape is disposed so as to cover the drain D and a part of the stacked gates 46 as depicted in FIG. 14.

Then, the silicon nitride layer 68 is removed for its thickness of accumulation by carrying out anisotropic etching having a high selectivity to silicon nitride by using the resist layer 56 as a mask. In this way, a part of the silicon nitride layer 68 located on the field oxidation layer 44 is removed. The reason of removing the silicon nitride layer 68 on the field oxidation layer 44, is that existence of the silicon nitride layer 68 thereon bothers removal thereof carried out in the subsequent process, that is the SAS etching process. The silicon nitride layer 68 located on the stacked gates 46 uncovered with the resist layer 56 and that located on silicon substrate 22, is removed simultaneous with that on the field oxidation layer 44.

Figure 15:
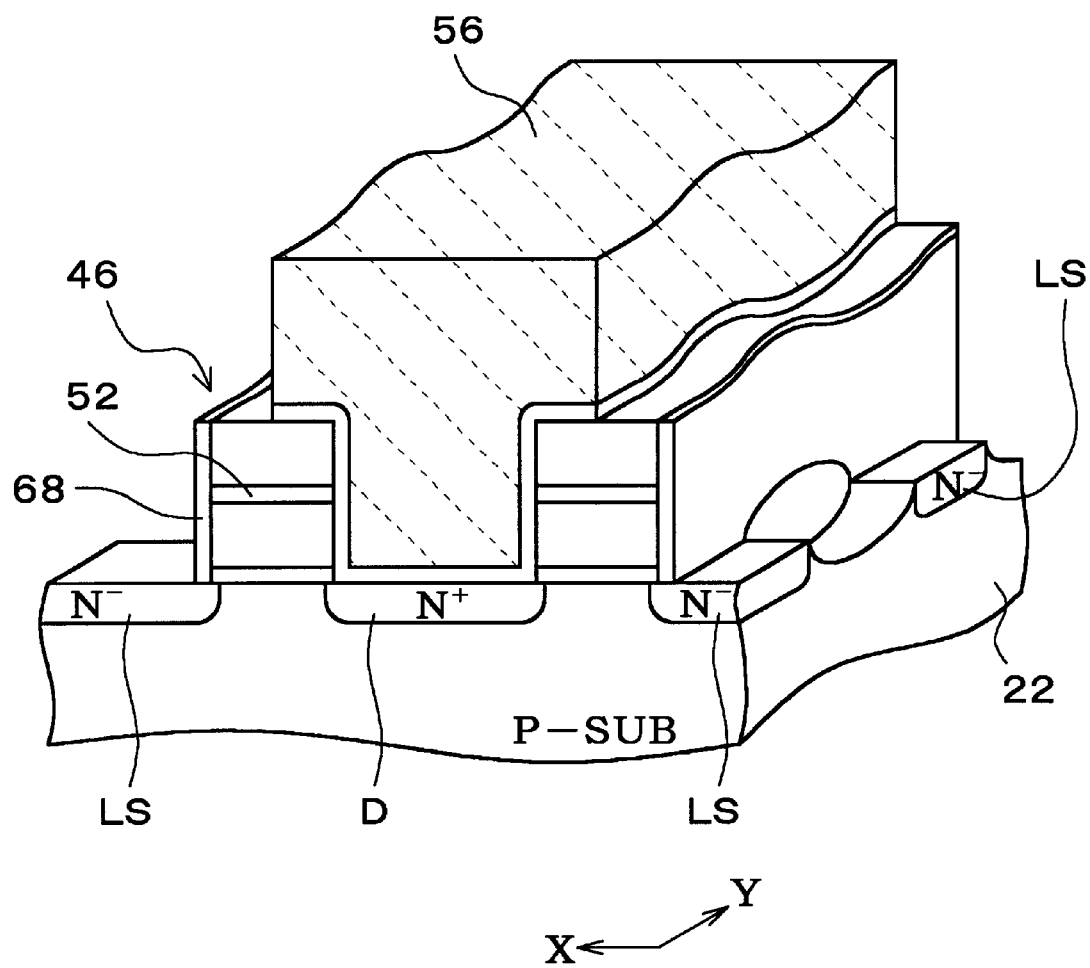
FIG. 15 is far another perspective view showing the memory array portion 26 for describing the manufacturing processes of the flash EPROM according to another embodiment of the present invention.

Thereafter, SAS etching having a high selectivity to silicon oxides is carried out by using the resist layer 56, the stacked gate 46, and the remained silicon nitride layer 68 as a mask as illustrated in FIG. 15.

The field oxidation layer 44 located between the low density sources LS (see FIG. 14) is removed selectively by carrying out the SAS etching as depicted in FIG. 15.

The silicon nitride layer 68 used as the insulation thin layer in this embodiment is not much etched, that is different from the earlier embodiment in which the thermal oxidation layer 58 is used as the insulation thin layer.

In this way, the gate edge 59 of the stacked gate 46 can fully be protected with the silicon nitride layer 68 without exposing thereof after carrying out the SAS etching even when a ratio of the stacked gate 46 in height to the field oxidation layer 44 in thickness is in a much small number because the silicon nitride layer 68 is hard to be etched during the SAS etching. The operation reliability can further be increased because the whole sides of the stacked gate 46 including the sides of the ONO layer 52 are protected by the silicon nitride layer 68 during the SAS etching.

Figure 16:
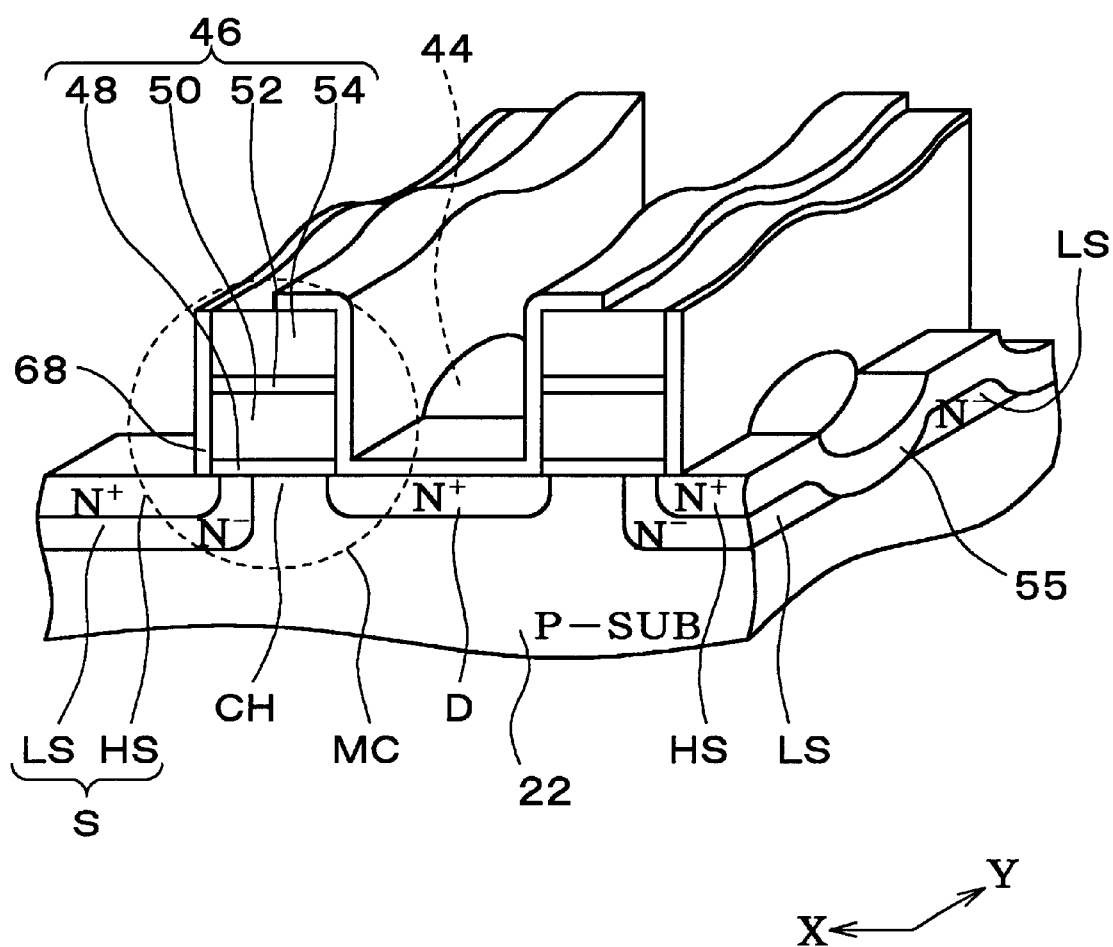
FIG. 16 is still another perspective view showing the memory array portion 26 for describing the manufacturing processes of the flash EPROM according to another embodiment of the present invention.

Processes carried out subsequent to the SAS etching are similar to that carried out in the earlier embodiment. That is, highly concentrated arsenic (As) is ionically implanted to all over the substrate using the resist layer 56, the stacked gate 46, and the remained silicon nitride layer 68 as a mask. Thereafter, a plurality of high density sources HS and the diffusion source wiring 55 formed by connecting the high density sources HS in the direction of Y, are formed by removing the resist layer 56, and then carrying out thermal treatment as depicted in FIG. 16. In this way, the diffusion source wiring 55 can be formed under self-aligning manner by substantially using the stacked gate 46 similar to that of the earlier embodiment.

(3) Third Embodiment

FIGS. 17 through 22 are perspective views for describing manufacturing processes of the flash EPROM according to far another embodiment of the present invention. Both a thermal oxidation layer 74 forming a first thin film and a silicon nitride layer 76 forming a second thin film are used as an insulation thin layer 78 in this embodiment.

Figure 17:
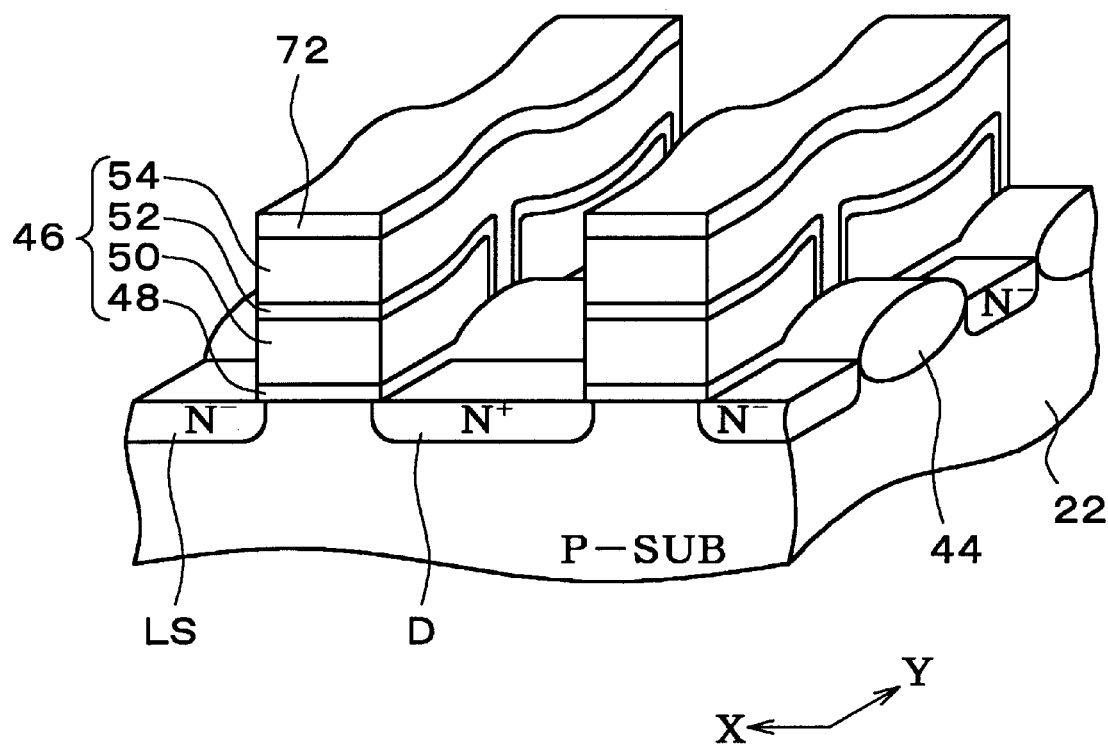
FIG. 17 is a perspective view showing the memory array portion 26 for describing manufacturing processes of the flash EPROM according to far another embodiment of the present invention.

All the processes carried out until completion of the field oxidation layer 44, are similar to the method described in the earlier embodiments (see FIG. 1). A cap layer 72 forming a third thin film is disposed on the upper surface of the stacked gate 46 formed in stripe shape as shown in FIG. 17. The cap layer 72 thus formed prevents the thermal oxidation layer 74 from etching even in the SAS etching as will be subsequently described (see FIG. 21).

The processes for disposing the stacked gate 46 and the cap layer 72 will be described. All the processes carried out until forming the poly-silicon layer and the tungsten-silicide (WSi) layer both of which to be the control gate 54, are the same as that to the earlier embodiments. That is, a thermal oxidation layer to be the gate oxidation layer 48, a poly-silicon layer forming the floating gate 50, an ONO layer to be the ONO layer 52, and another poly-silicon layer and a tungsten-silicide (WSi) layer both forming the control gate 54, are formed in that order.

Thereafter, a silicon nitride layer to be the cap layer 72 is disposed on the tungsten-silicide (WSi) layer by means of a low pressure CVD method or similar method. In this embodiment, the silicon nitride layer is formed approximately 800 angstroms in thickness.

Next, the stacked gate 46 and the cap layer 72 are formed by carrying out patterning of the silicon nitride layer, the poly-silicon layer, the tunsten-silicide (WSi) layer, the ONO layer, the poly-silicon layer extending in the direction of X as longitudinal direction in stripe shape, and the thermal oxidation layer. The layers composing the stacked layer 46 are formed similar in thickness to the layers used in the earlier embodiments, but the thickness thereof is not limited to the specific number.

Then, a low density source LS of N⁻ type and a drain D of N⁺ type are formed under self-aligning manner using the stacked gate 46 by carrying out similar processes to the earlier embodiment.

Figure 18:
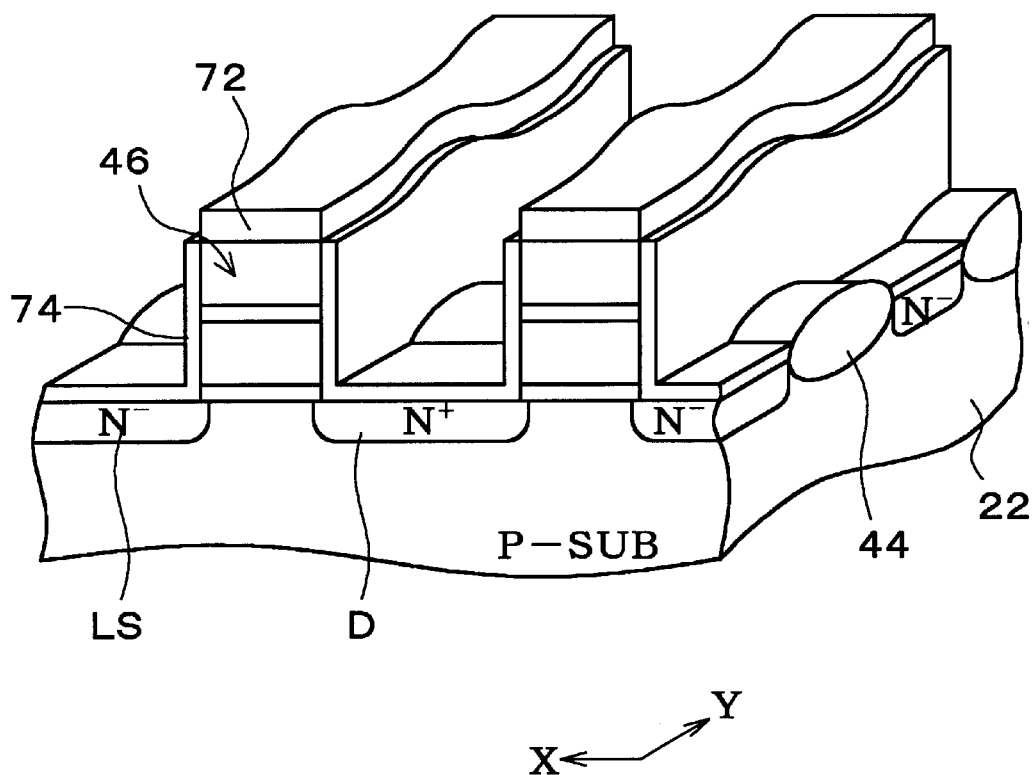
FIG. 18 is another perspective view showing the memory array portion 26 for describing the manufacturing processes of the flash EPROM according to far another embodiment of the present invention.

The thermal oxidation layer 74 is formed on the sides of the stacked gate 46 by carrying out thermal oxidation to the surface as depicted in FIG. 18. The use of the thermal oxidation layer 74 as the first thin film provides advantages of an easy control of its thickness as well as a high insulation capability because of its dense structure.

As depicted in FIG. 18, the thermal oxidation layer 74 is formed in a predetermined thickness on the silicon exposed from the semiconductor substrate 22, but it is formed slightly on both of the upper surface and the sides of the cap layer 72. In this way, thin thermal oxidation layers disposed on the sides of the cap layer 72 and vicinity thereof not cause any serious problems. It is much preferred to remove the thin thermal oxidation layers disposed on the sides of the cap layer 72 and vicinity thereof by carrying out etching slightly.

Figure 19:
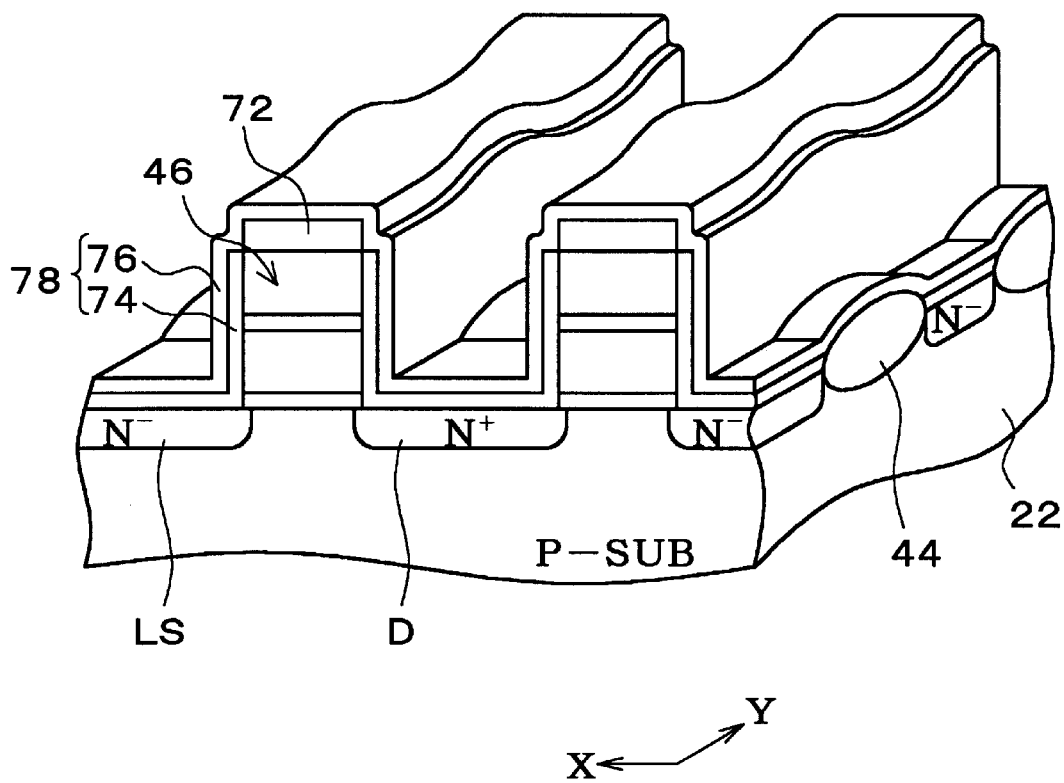
FIG. 19 is another perspective view showing the memory array potion 26 for describing the manufacturing processes of the flash EPROM according to far another embodiment of the present invention.

Thereafter, the silicon nitride layer 76 is formed as the second thin film as depicted in FIG. 19. The silicon nitride layer 76 is disposed by accumulating silicon nitride as thin films by means of CVD method.

In this manner, the silicon nitride layer 76 is disposed so as to cover the thermal oxidation layer 74 formed on the sides of the stacked gate 46. The silicon nitride layer 76 formed as thin films, is also formed on the upper surface and the sides of the cap layer 72, on the thermal oxidation layer 74 formed on the semiconductor substrate 22, and on the field oxidation layer 44.

The thermal oxidation layer 74 and the silicon nitride layer 76 are respectively formed approximately 100 angstroms in thickness in this embodiment. In other words, the insulation thin layer 78 composed of both the thermal oxidation layer 74 and the silicon nitride layer 76 is formed approximately 200 angstroms in thickness, the thickness thereof is not limited to the specific number similar to that described in the earlier embodiment.

Figure 20:
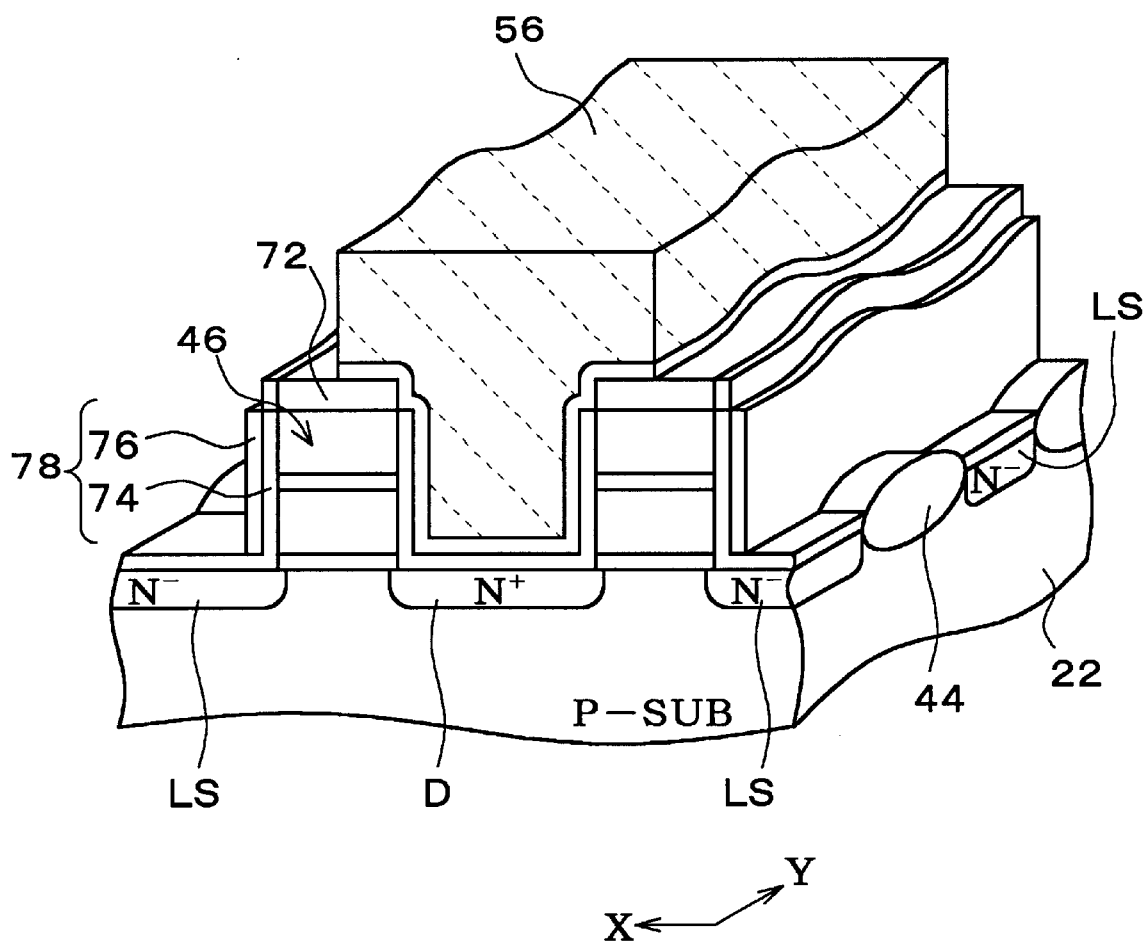
FIG. 20 is another perspective view showing the memory array portion 26 for describing the manufacturing processes of the flash EPROM according to far another embodiment of the present invention.

Next, a resist layer 56 is formed on a predetermined position, and the silicon nitride layer 76 is removed for its thickness of accumulation by carrying out anisotropic etching having a high selectivity to silicon nitride using the resist layer 56 as a mask as depicted in FIG. 20. In this way, a part of the silicon nitride layer 68 located on the field oxidation layer 44 is removed.

As described earlier, the sides of the thermal oxidation layer 74 formed on the stacked gate 46 are covered with the silicon nitride layer 76. Further, the silicon nitride layer 76 is formed on the sides of the cap layer 72 (in other words, upper surface of the thermal oxidation layer 74 formed on the sides of the stacked gate 46).

In this way, neither the sides of the thermal oxidation layer 74 formed on the sides of the stacked gate 46 nor the upper surface thereof, are exposed even when the silicon nitride layer 76 for its thickness of accumulated thereon is removed.

As a result, the thermal oxidation layer 74 formed on the sides of the stacked gate 46, is never be etched during the SAS etching. In other words, the insulation thin layer 78 composed of both the thermal oxidation layer 74 and the silicon nitride layer 76 which covers the thermal oxidation layer 74, can easily be obtained by forming the cap layer 72.

The silicon nitride layer 76, formed on the upper surface of the exposed cap layer 72 and that located on the thermal oxidation layer 74 on the semiconductor substrate 22, are removed at the same time.

Figure 21:
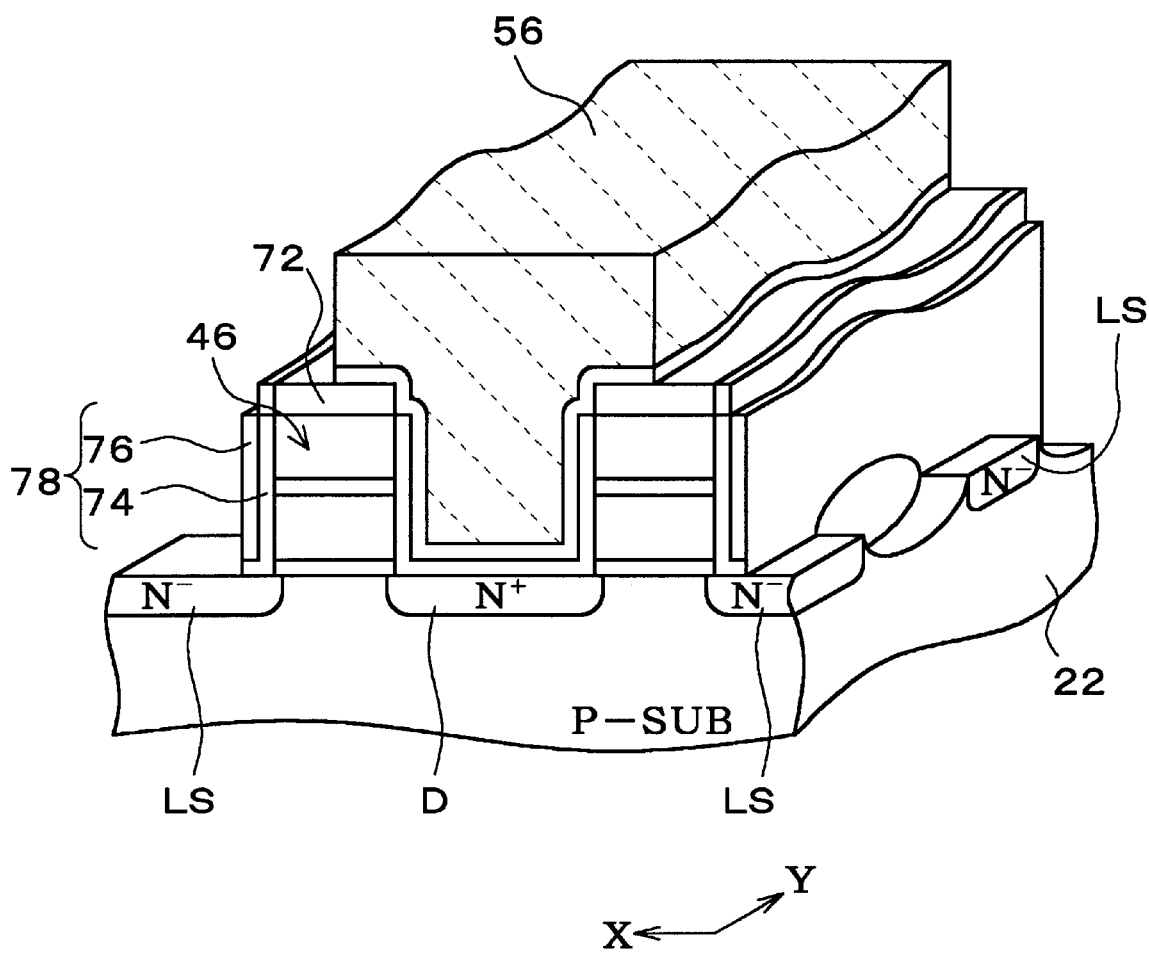
FIG. 21 is another perspective view showing the memory array portion 26 for describing the manufacturing processes of the flash EPROM according to far another embodiment of the present invention.

Next, SAS etching having a high selectivity to silicon oxides is carried out by using the resist layer 56, the cap layer 72, and the remained insulation thin layer 78 as a mask as depicted in FIG. 21.

The field oxidation layer 44 located between the low density sources LS (see FIG. 20) is removed selectively by carrying out the SAS etching as depicted in FIG. 21. The insulation thin layer 78, on the other hand, is not much etched during the SAS etching because the exterior thereof is made of the silicon nitride layers 76.

As described earlier, the insulation thin layer 78 is composed of the thermal oxidation layer 74 which substantially protects the sides of the stacked gate 46 and the silicon nitride layers 76 covering the thermal oxidation layer 74.

In this way, electric charges trapped into the insulation thin layer, that should be trapped into/discharged from the floating gate 50, can be prevented by directly covering the stacked gate 46 with the thermal oxidation layer which is hard to trap electric charges therein in comparison with a silicon nitride layer. As a result, undesired variation of the electric field (that is, unstable operations observed during writing and erasing the data) caused by the trap of electric charges into the insulation thin layer, may be avoided.

Further, the gate edge 59 can fully be protected in the SAS etching by covering the thermal oxidation layer 74 with the silicon nitride layer 76 which is hard to be etched even in the SAS etching. The operation reliability can further be increased because the whole sides of the stacked gate 46 including the sides of the ONO layer 52 are protected during the SAS etching.

Figure 22:
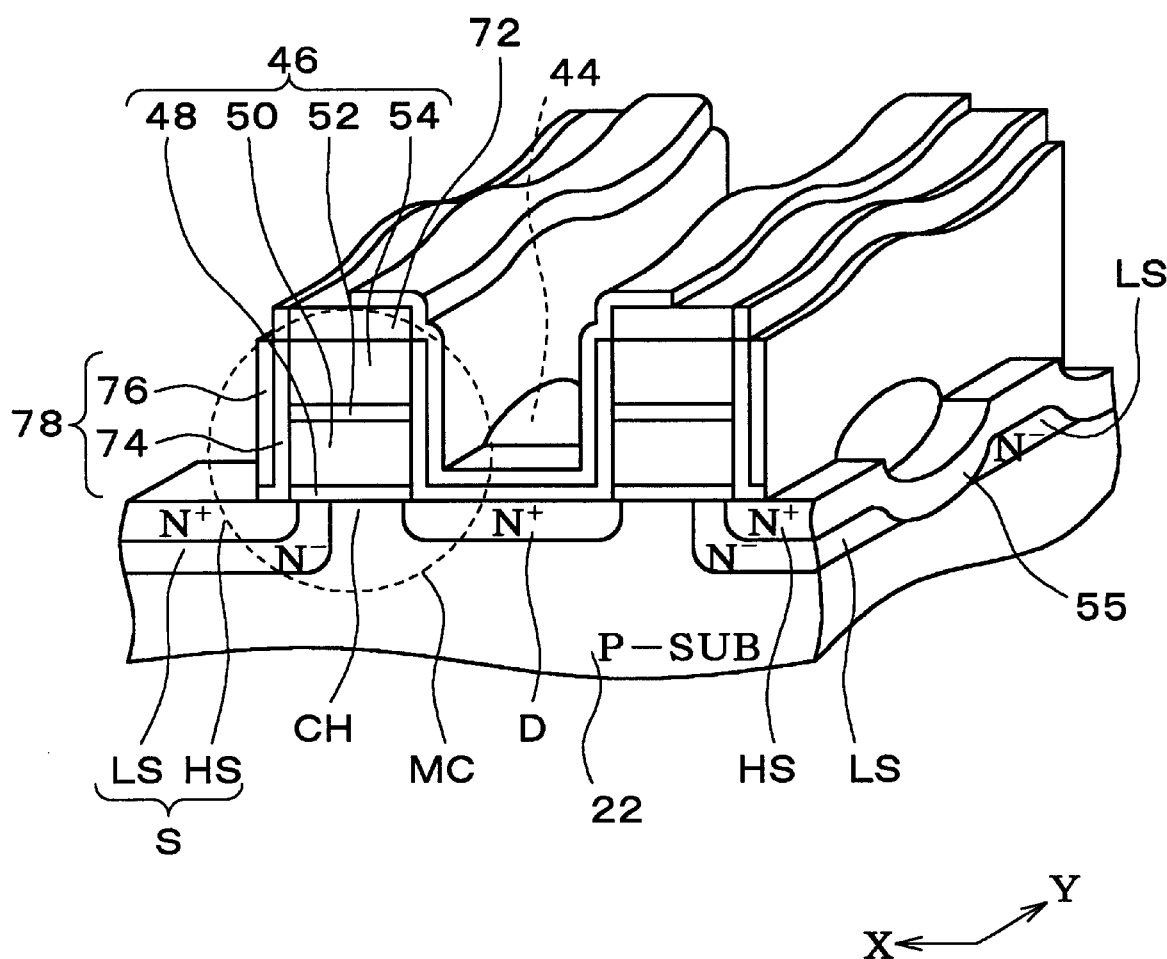
FIG. 22 is another perspective view showing the memory array portion 26 for describing the manufacturing processes of the flash EPROM according to far another embodiment of the present invention.

Processes carried out subsequent to the SAS etching are similar to that carried out in the earlier embodiments. That is, highly concentrated arsenic (As) is ionically implanted to all over the substrate using the resist layer 56, the cap layer 72, and insolation thin layer 78 remained on the sides of the stacked gate 46 as a mask. Thereafter, a plurality of high density sources HS and the diffusion source wiring 55 formed by connecting the high density sources HS in the direction of Y, are formed by removing the resist layer 56, and then carrying out thermal treatment as depicted in FIG. 22. In this way, the diffusion source wiring 55 can be formed under self-aligning manner by substantially using the stacked gate 46 similar to the earlier embodiments.

(4) Other Embodiments

Although, either of the silicon nitride layer 68 or the silicon nitride layer 76 is removed for its thickness of accumulation after forming the resist layer 56 in both the embodiments shown in FIGS. 13 through 16, and in FIGS. 17 through 22, the process for removing either of these layers for its thickness of accumulation can be carried out before forming the resist layer 56.

Though, both the low density source LS and the drain D are formed before carrying out the SAS etching, and the diffusion source wiring 55 formed by connecting the high density sources HS in the direction of Y is formed after the SAS etching in the earlier embodiments, the processes for forming the low density source LS, the drain D and the diffusion source wiring 55 are not limited to that order. For example, the drain D and the diffusion source wiring 55 may be formed within the same process.

An example of the processes for forming both the drain D and the diffusion source wiring 55 within the same process will be described by using the earlier embodiment shown in FIGS. 1 through 12.

Figure 23:
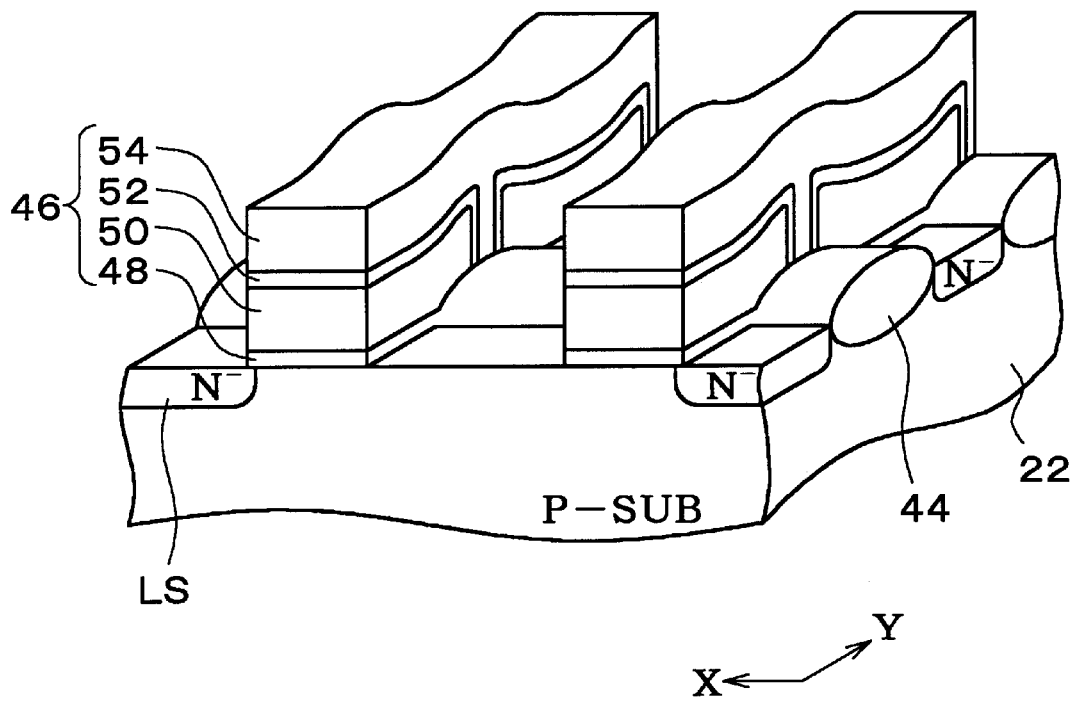
FIG. 23 is a perspective view showing the memory array portion 26 for describing manufacturing processes of the flash EPROM according to still another embodiment of the present invention.
Figure 24A:
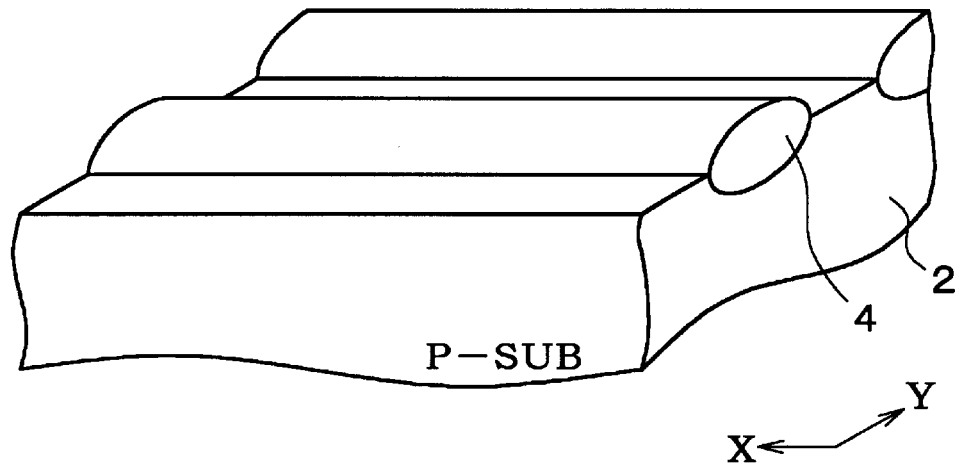
FIGS. 24A and 24B are perspective views for describing a manufacturing method of memory array using the conventional SAS technology.
Figure 24B:
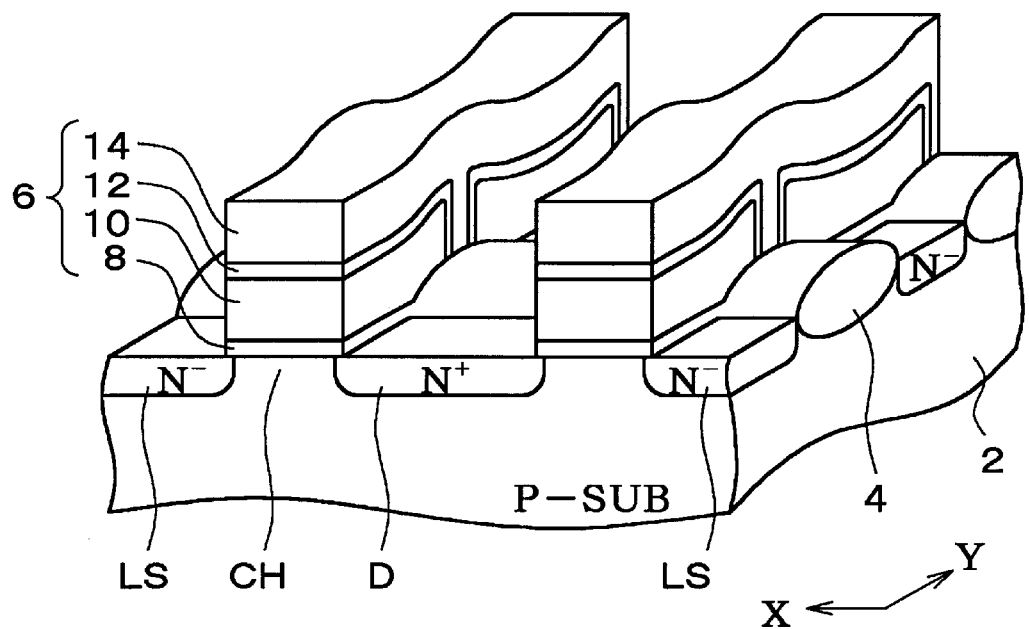
Figure 25A:
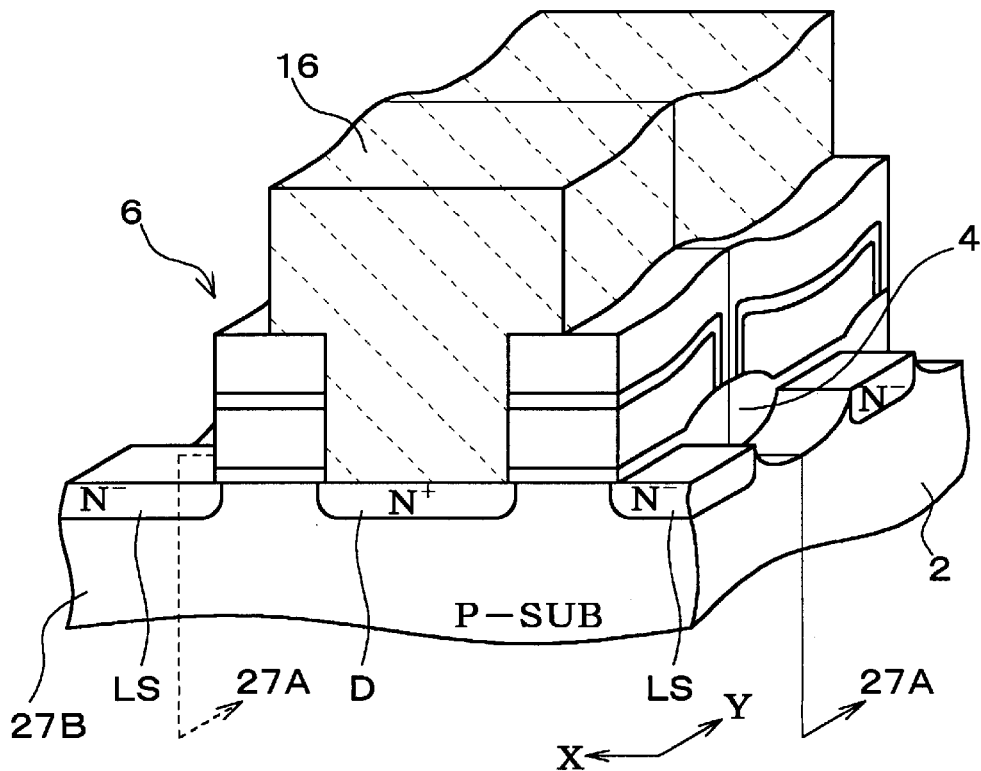
FIGS. 25A and 25B are perspective views for describing the manufacturing method of the memory array using the conventional SAS technology.
Figure 25B:
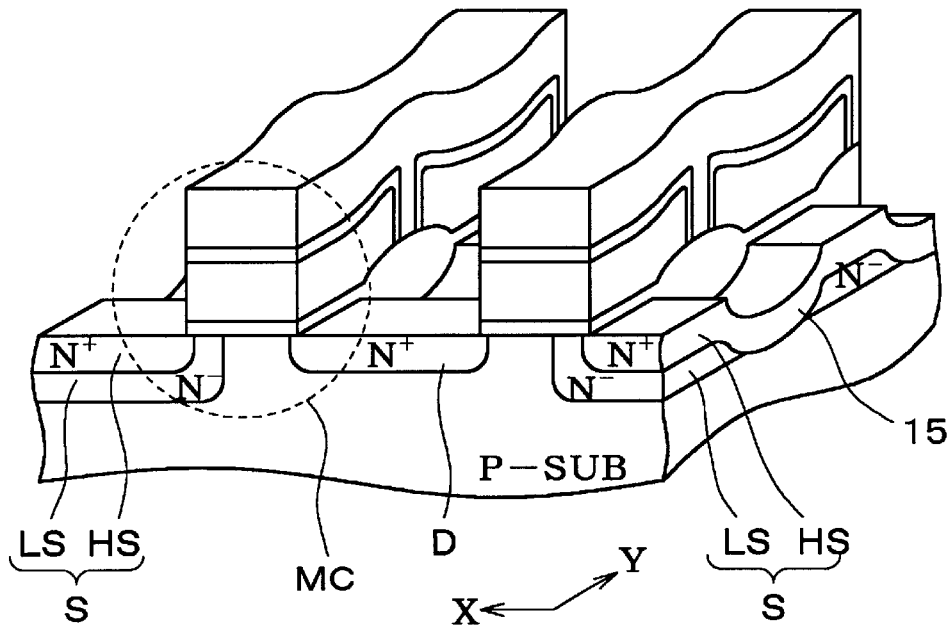
Figure 26:
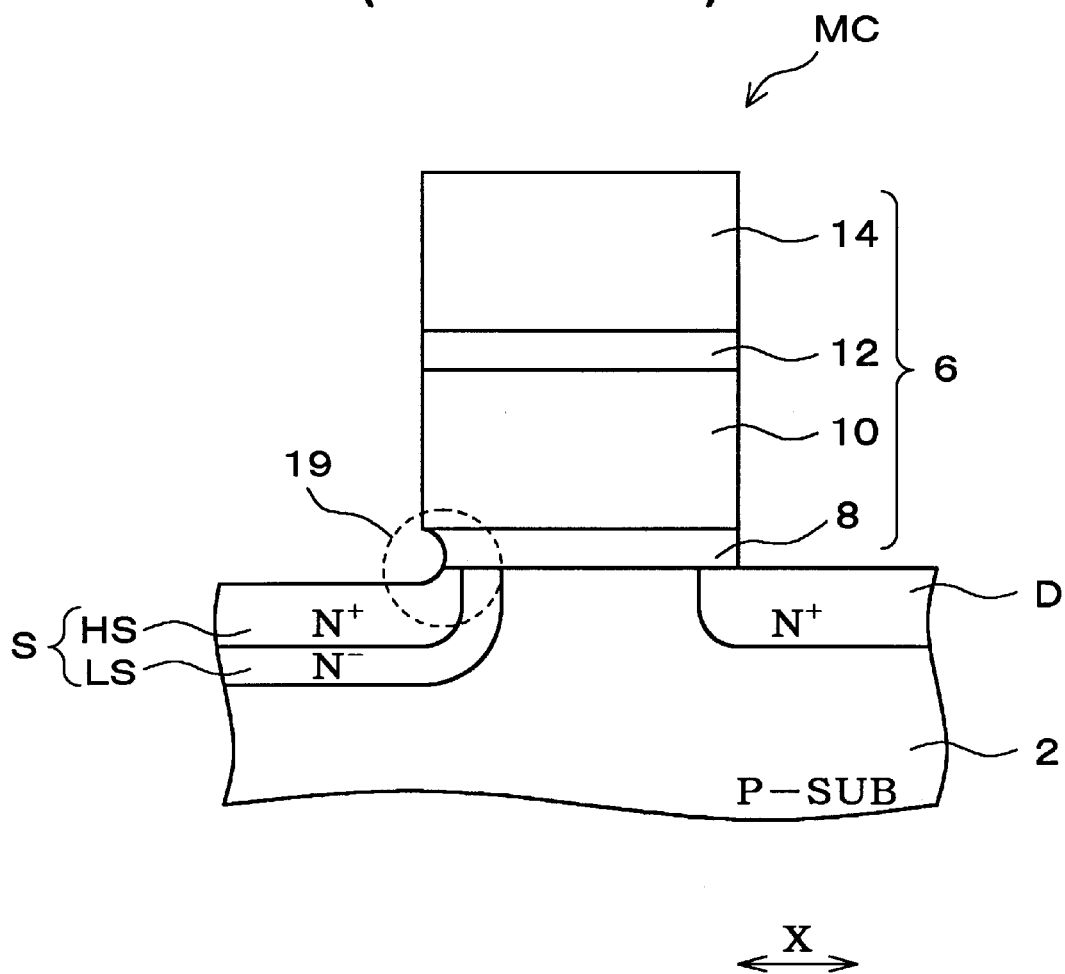
FIG. 26 is a sectional view illustrating a memory cell portion MC formed by a manufacturing method using the conventional SAS technology.
Figure 27A:
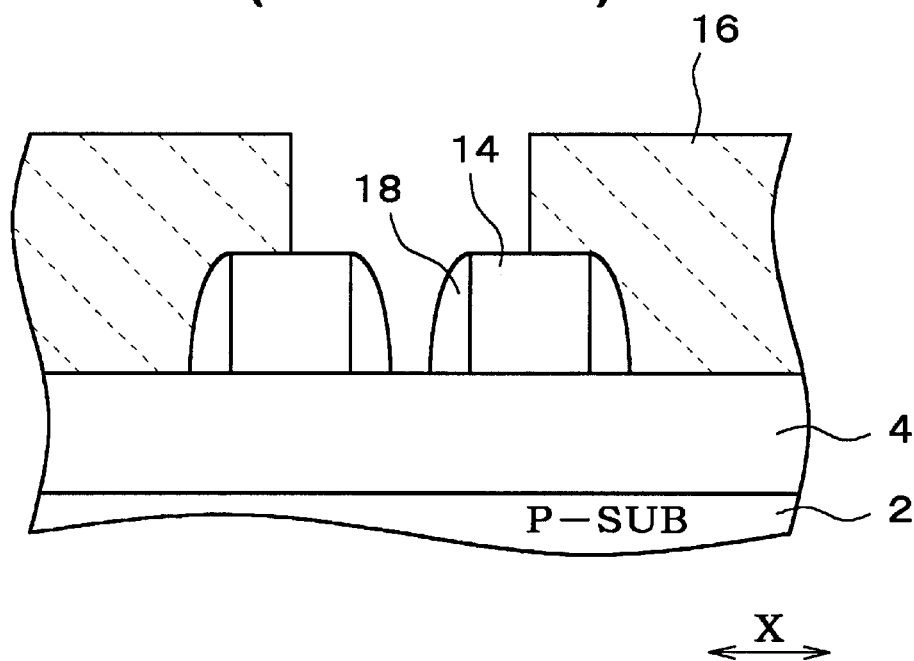
FIG. 27A is a sectional view corresponding to a section 27A depicted in FIG. 25A which shows the memory array formed by using the improved conventional SAS technology.
Figure 27B:
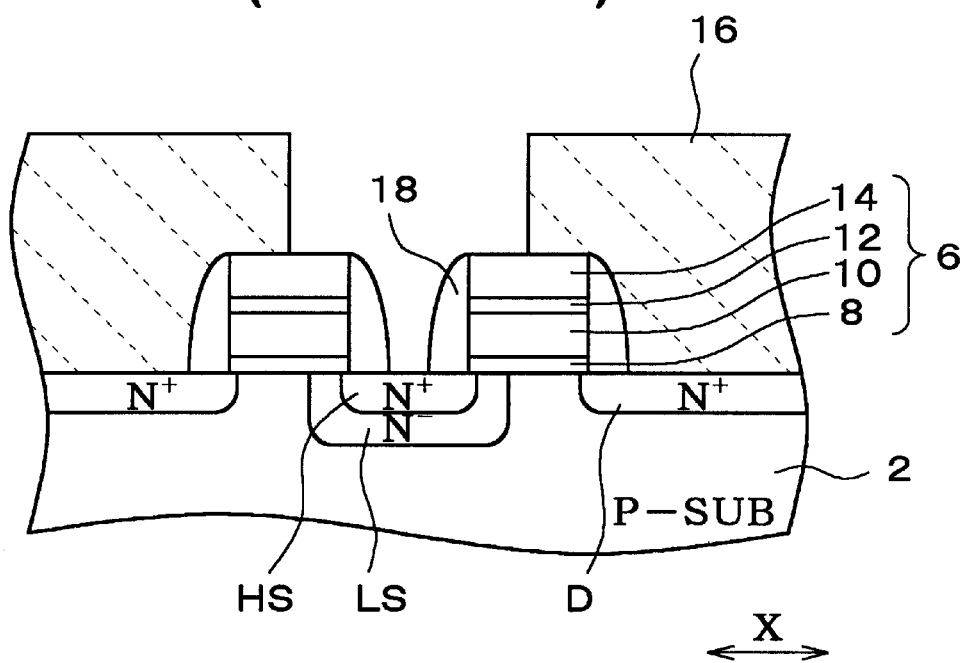
FIG. 27B is another sectional view corresponding to a section 27B depicted in FIG. 25A which shows the memory array formed by using the improved conventional SAS technology.
Figure 28A:
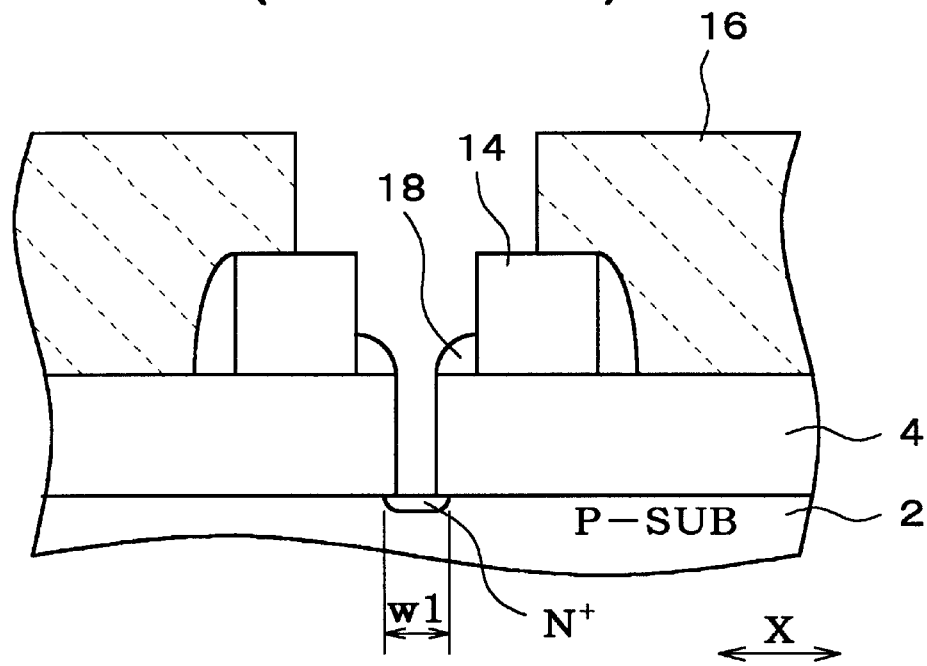
FIG. 28A is a sectional view corresponding to the section 27A depicted in FIG. 25A which shows the memory array formed by using the improved conventional SAS technology.
Figure 28B:
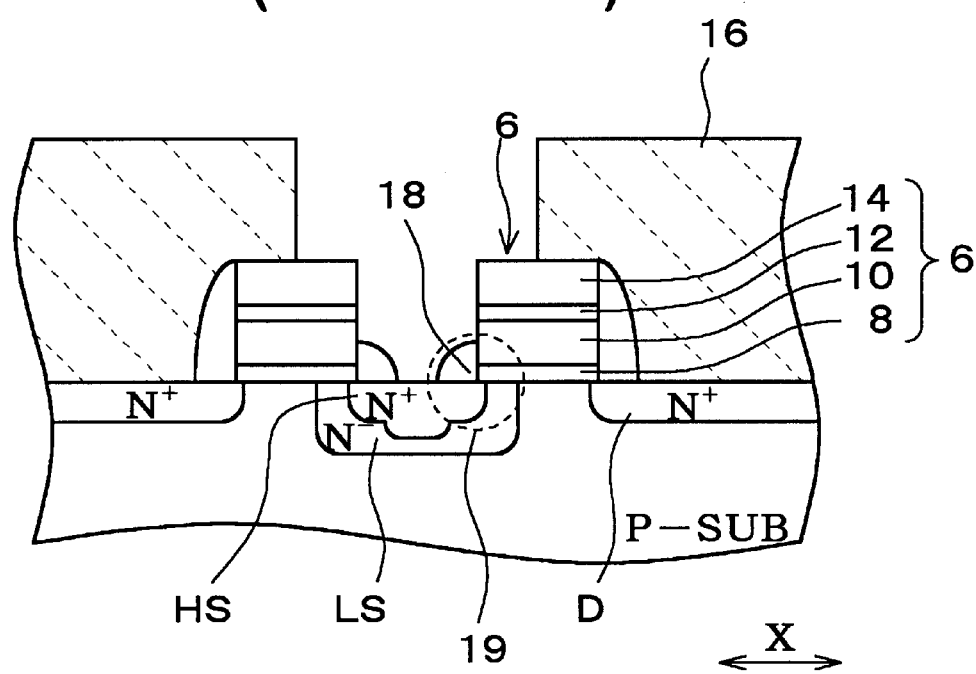
FIG. 28B is another sectional view corresponding to the section 27B depicted in FIG. 25A which shows the memory array formed by using the improved conventional SAS technology.
Figure 29:
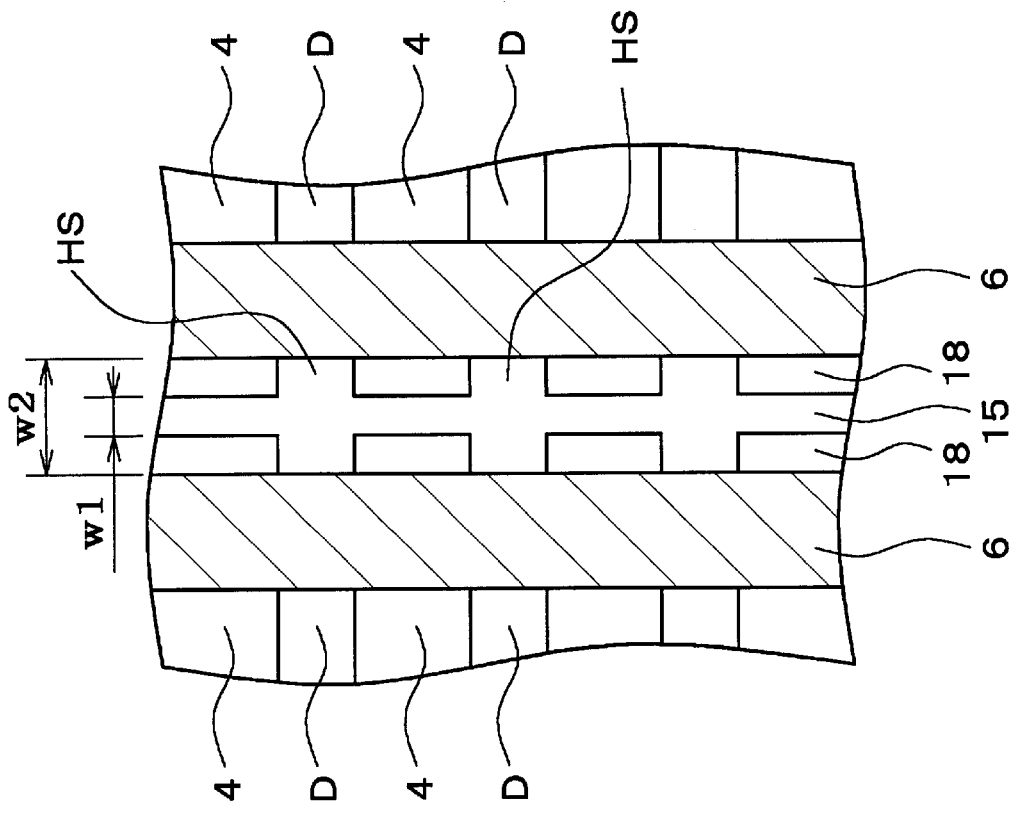
FIG. 29 is a plan view conceptually illustrating the memory array portion formed by using the improved conventional SAS technology.

Initially, a stacked gate 46 is disposed after forming a field oxidation layer 44 as shown in FIG. 1. Then, an N⁻ type low density source LS is formed under self-aligning manner using the stacked gate 46 solely as depicted in FIG. 23.

All the subsequent processes carried out until completion of the SAS etching are similar to that carried out in the earlier embodiment shown in FIGS. 1 through 12. In this embodiment, however, the resist layer 56 is removed after the SAS etching, then highly concentrated arsenic (As) is ionically implanted to all over the substrate by using the stacked gate 46 and the remained field oxidation layer 44 as a mask.

In this way, both the drain D and the diffusion source wiring 55 formed by connecting the high density sources HS in the direction of Y, are formed at the same time by carrying out thermal treatment as shown in FIG. 6.

As described above, both the diffusion source wiring 55 and the drain D are formed in the semiconductor substrate 22 including the semiconductor region where the field oxidation layer 44 is substantially removed under self-aligning manner using both the stacked gate 46 and the un-etched field oxidation layer 44 after the SAS etching.

In this way, both the drain D and the diffusion source wiring 55 connecting the high density sources HS in the direction of Y, are formed at the same time. As a result, the number of ion implantation process which associates complex steps such as mask formation and so on may be decreased. In other words, the manufacturing cost of the device can be reduced.

It is further preferred to carry out slight thermal oxidation prior to carrying out the ion implantation when the ion implantation is carried out after removing the resist layer 56 used for the SAS etching. The reason of forming a thermal oxidation layer is to prevent damages caused on the surface of the semiconductor substrate 22 and that of the stacked gate 46 by the ion implantation.

Although, the low density source LS is formed before carrying out the SAS etching in this embodiment, the low density source LS may be formed after the SAS etching similar to the formation of both the drain D and the diffusion source wiring 55. In that case, the low density source LS is formed after carrying out the SAS etching, and both the drain D and the diffusion source wiring 55 may be formed thereafter.

On the contrary, the formation of the diffusion source wiring 55 by connecting the high density sources HS may be carried out after the SAS etching when the low density source LS, the high density source HS, and the drain D are formed before carrying out the SAS etching similar to the prior art.

In the earlier embodiments, each of the thermal oxidation layer, the silicon oxidation thin layer formed by means of CVD method, the silicon nitride layer, and the layer having a stacked structure that is composed of both a thermal oxidation layer and a silicon nitride layer, is used as the insulation thin layer. The material thereof is not limited to these. One of a silicon oxidation and nitride layer (a thin layer including both silicon oxides and silicon nitride), a thin layer having a stacked structure in more than two thin films, and other types of thin layer may also be used for the insulation thin layer.

Although, the ONO layer 52 is exampled as the upper insulation layer in the earlier embodiments, the upper insulation layer is not limited to the ONO layer. For example, an upper insulation layer made of a single structured silicon oxidation layer may be applied to a semiconductor memory device according to the present invention. Flash EPROM has been used as the semiconductor device in the earlier embodiments, the present invention can be applied to other semiconductor memory devices.

The present invention is characterized in that, an insulation thin layer is formed so as to substantially cover sides of the stacked gate, and the device separating insulation layer is substantially removed under self-aligning manner using the stacked gate by means of selective etching. Then, the first high density impurity region is formed under self-aligning manner by substantially using the stacked gate in a semiconductor region where includes the semiconductor region selectively removing a part of the device separating insulation layer.

In this way, a side of the lower insulation layer composing the stacked gate is covered with the insulation thin layer so that the sides of the lower insulation layer never be etched by the selective etching. As a result, a high operation reliability such as data writing may be expected.

Further, decrease of the first high density impurity region in width can be minimized during the formation thereof by using both the stacked gate and the insulation thin layer as a mask because of forming the insulation thin layer thin in its thickness. In this way, a predetermined width can be maintained for the first high density impurity region without widening the width between the stacked gates located adjacently. As a result, unexpected increase of electric resistance in the first high density impurity region formed consecutively in the column direction may be avoided without sacrificing the integration of the semiconductor memory.

In other words, a semiconductor memory device capable of increasing the integration thereof and having a high operation reliability can be realized.

The present invention is characterized in that, the insulation thin layer is formed as a thin layer mainly made of silicon oxides.

It is, therefore, possible to form a insulation thin layer by means of thermal oxidation method or CVD (chemical vapor deposition) method or similar method easily.

Further, the present invention is characterized in that, the insulation thin layer is formed as a thin layer mainly made of silicon nitride.

In this way, the side of the lower insulation layer can be protected with the insulation thin layer during the selective etching having a high selectivity to silicon oxide even when a ratio of the stacked gate in height to the device separating insulation layer in thickness is in a much small number because the silicon nitride is hard to be etched in the selective etching. Also, the operation reliability can further be increased because the whole sides of the stacked gate are protected during the selective etching.

Still further, the present invention is characterized in that, the thin layer mainly made of silicon nitride is disposed on the entire surface of the memory array portion after forming the stacked gate, and the thin layer located on the device separating insulation layer that is to be removed by the selective etching, is at least removed by removing the thin layer for its thickness of accumulation by carrying out anisotropic etching.

In this way, the device separating insulation layer can be easily removed by carrying out selective etching subsequently by means of exposing the device separating insulation layer through removal of a thin layer located thereon which is made mainly of silicon nitride.

The present invention is characterized in that, the insulation thin layer includes both a first thin film made mainly of silicon oxides and substantially covering sides of the stacked gate, and a second thin film made mainly of silicon nitride and forming so as to substantially cover the first thin film.

In this way, undesirable trap of electric charges through the side of the stacked gate is prevented by covering the sides thereof with the first thin film made mainly of silicon oxides which is hard to trap electric charges therein. Whole sides of the stacked gate are protected in addition to full protection of the side of the lower insulation layer during the selective etching by covering the first thin film with the second thin film made mainly of silicon nitride which is hard to be etched even in the selective etching. Consequently, the operation reliability can further be increased.

Further, the present invention is characterized in that, a third thin film made mainly of silicon nitride is further disposed on the upper conductive layer when the stacked gate is formed, and the first thin film is formed so as to substantially cover sides of the stacked gate after forming the third thin film. The second thin film is disposed on the entire surface of the memory array portion after forming the first thin film, and the second film located on the device separating insulation layer that is to be removed by the selective etching, is at least removed by removing the second thin film for its thickness of accumulation by carrying out anisotropic etching. And the device separating insulation layer is removed by carrying out the selective etching.

In other words, the sides and the upper surface of the first thin film formed on the sides of the stacked gate are covered with the second thin film before carrying out anisotropic etching. In this way, the sides and the upper surface of the first thin film never be exposed even when the second thin film is removed for its thickness of accumulation. Consequently, the first thin film never be etched by selective etching which will be carried out subsequently. As a result, the insulation thin layer including both the first thin film which covers the sides of the stacked gate and the second thin film formed on the first thin film so as to cover thereon, can easily be obtained.

Still further, the present invention is characterized in that, the insulation thin layer is formed within in a range from approximately similar thickness to the lower insulation layer through a thickness in about ten times of the lower insulation layer.

In this way, the probability of a current flow from the first high density impurity region to the lower conductive layer through the insulation thin layer, that should be flow thereto through the lower insulation layer, may be remarkably lowered, and the decrease of the first high density impurity region in width can be minimized. In other words, the decrease of the first high density impurity region in width can be minimized while maintaining insulation of the insulation thin layer.

The present invention is characterized in that, both the first high density impurity region and the second high density impurity region are formed under self-aligning manner by substantially using the stacked gate and un-etched device separating insulation layer in the semiconductor region including the semiconductor region where the device separating insulation layer is selectively removed, after carrying out the selective etching.

In this way, both the second high density impurity region and the first high density impurity region successively formed in the column direction, can be formed within the same process. As a result, the number of ion implantation process which associates complex steps such as mask formation and so on may be decreased. In other words, the manufacturing cost of the device can be reduced.

Further, the present invention is characterized in that the stacked gate having an insulation layer having a height such that the insulation layer substantially covers at least to an upper end of the lower insulation layer.

In this way, the operation reliability such as data writing and so on can further be increased with certainty by covering the side and vicinity of the lower insulation layer which plays an important role for the operation such as data writing and so on with the insulation thin layer.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method of manufacturing a semiconductor device comprising a memory array portion, the memory array portion including a plurality of memory cells arranged in a matrix form, each of the memory cells having the following elements (A) through (C);

(A) a channel formation region of a first conductive type defined in a semiconductor region provided on a semiconductor substrate;

(B) a first high density impurity region and a second high density impurity region both of a second conductive type, and both arranged so as to interpose the channel formation region; and (C) a stacked gate formed on the channel formation region including the following layers (C1) through (C4);
(C1) a lower insulation layer formed on the channel formation region,
(C2) a lower conductive layer disposed on the lower insulation layer,
(C3) an upper insulation layer situated on the lower conductive layer, and
(C4) an upper conductive layer located on the upper insulation layer, wherein in the memory array portion the upper conductive layer of the memory cells belong to the same column, is formed so as to connect the memory cells, and wherein the first high density impurity region and the second high density impurity region in each of the memory cells are respectively formed successively among the memory cells arranged adjacently in a row direction, and wherein the first high density impurity regions in the memory cells belong to two different columns adjacently arranged so as to interpose the first high density impurity region therebetween are formed successively in a column direction, and wherein the second high density impurity regions in the memory cells belong to two different columns adjacently arranged so as to interpose the second high density impurity region therebetween are electrically isolated with each other in the column direction by a device separating insulation layer, the manufacturing method, comprising the steps of:
forming the device separating insulation layer extending in the row direction on the semiconductor region in stripe shape;
disposing the stacked gate on both the semiconductor region and the device separating insulation layer formed in stripe shape in the column direction of the memory cells in stripe shape;
forming an insulation thin layer substantially covering sides of the stacked gate;
removing the device separating insulation layer in a self-aligning manner by substantially using the stacked gate by means of selective etching; and
forming the first high density impurity region in a self-aligning manner by substantially using the stacked gate in the semiconductor region selectively removing a part of the device separating insulation layer, wherein the insulation thin layer includes a first thin film made mainly of silicon oxides and substantially covers the sides of the stacked gate, and a second thin film made mainly of silicon nitride and formed so as to substantially cover the first thin film.

2. The manufacturing method in accordance with claim 1, wherein a third thin film made mainly of silicon nitride is further disposed on the upper conductive layer when the stacked gate is formed;

and wherein the first thin film is formed so as substantially to cover the sides of the stacked gate after forming the third thin film;
and wherein the second thin film is disposed on the entire surface of the memory array portion after forming the first thin film;
and wherein the second film located on the device separating insulation layer that is to be removed by the selective etching, is at least removed by removing the second thin film for its thickness of accumulation by carrying out anisotropic etching;
and wherein the device separating insulation layer is removed by carrying out the selective etching.

3. The manufacturing method in accordance with claim 1, wherein the first thin film is formed by thermal oxidation method.

4. The manufacturing method in accordance with claim 1, wherein the first thin film at least disposed on sides of the third thin film is removed by carrying out etching within a duration after the formation of the first thin film and before the deposition of the second thin film.

5. The manufacturing method in accordance with claim 1, wherein the second thin film is formed by means of chemical vapor deposition (CVD).

6. The manufacturing method in accordance with claim 1, wherein the third thin film is formed by means of chemical vapor deposition (CVD).

7. The manufacturing method in accordance with claim 1, wherein the insulation thin layer is formed in a range from approximately similar thickness to the lower insulation layer through a thickness in about ten times of the lower insulation layer.

8. A method of manufacturing a semiconductor device comprising a memory array portion, the memory array portion including a plurality of memory cells arranged in a matrix form, each of the memory cells having the following elements (A) through (C);

(A) a channel formation region of a first conductive type defined in a semiconductor region provided on a semiconductor substrate;

(B) a first high density impurity region and a second high density impurity region both of a second conductive type, and both arranged so as to interpose the channel formation region; and (C) a stacked gate formed on the channel formation region including the following layers (C1) through (C4);
(C1) a lower insulation layer formed on the channel formation region,
(C2) a lower conductive layer disposed on the lower insulation layer,
(C3) an upper insulation layer situated on the lower conductive layer, and
(C4) an upper conductive layer located on the upper insulation layer, wherein in the memory array portion the upper conductive layer of the memory cells belong to the same column, is formed so as to connect the memory cells, and wherein the first high density impurity region and the second high density impurity region in each of the memory cells are respectively formed successively among the memory cells arranged adjacently in a row direction, and wherein the first high density impurity regions in the memory cells belong to two different columns adjacently arranged so as to interpose the first high density impurity region therebetween are formed successively in a column direction, and wherein the second high density impurity regions in the memory cells belong to two different columns adjacently arranged so as to interpose the second high density impurity region therebetween are electrically isolated with each other in the column direction by a device separating insulation layer, the manufacturing method, comprising the steps of:
forming the device separating insulation layer extending in the row direction on the semiconductor region in stripe shape;
disposing the stacked gate on both the semiconductor region and the device separating insulation layer formed in stripe shape in the column direction of the memory cells in stripe shape;
forming an insulation thin layer substantially covering sides of the stacked gate;
removing the device separating insulation layer in a self-aligning manner by substantially using the stacked gate by means of selective etching; and
forming the first high density impurity region in a self-aligning manner by substantially using the stacked gate in the semiconductor region selectively removing a part of the device separating insulation layer, wherein the device separating insulating layer is selectively removed in a self-aligning manner by substantially using the stacked gate and the unetched device separating insulating layer after carrying out the selective etching;
wherein the second high density impurity region is formed in the semiconductor region in a self-aligning manner using both the stacked gate and the device separating insulation layer prior to carrying out the selective etching,
and wherein the device separating insulation layer is then removed by carrying out the selective etching.

9. A method of manufacturing a semiconductor device comprising a memory array portion, the memory array portion including a plurality of memory cells arranged in a matrix form, each of the memory cells having the following elements (A) through (C);

(A) a channel formation region of a first conductive type defined in a semiconductor region provided on a semiconductor substrate;

(B) a first high density impurity region and a second high density impurity region both of a second conductive type, and both arranged so as to interpose the channel formation region; and (C) a stacked gate formed on the channel formation region including the following layers (C1) through (C4);
  (C1) a lower insulation layer formed on the channel formation region,
  (C2) a lower conductive layer disposed on the lower insulation layer,
  (C3) an upper insulation layer situated on the lower conductive layer, and
  (C4) an upper conductive layer located on the upper insulation layer, wherein in the memory array portion the upper conductive layer of the memory cells belong to the same column, is formed so as to connect the memory cells, and wherein the first high density impurity region and the second high density impurity region in each of the memory cells are respectively formed successively among the memory cells arranged adjacently in a row direction, and wherein the first high density impurity regions in the memory cells belong to two different columns adjacently arranged so as to interpose the first high density impurity region therebetween are formed successively in a column direction, and wherein the second high density impurity regions in the memory cells belong to two different columns adjacently arranged so as to interpose the second high density impurity region therebetween are electrically isolated with each other in the column direction by a device separating insulation layer, the manufacturing method, comprising the steps of:
  forming the device separating insulation layer extending in the row direction on the semiconductor region in stripe shape;
  disposing the stacked gate on both the semiconductor region and the device separating insulation layer formed in stripe shape in the column direction of the memory cells in stripe shape;
  forming an insulation thin layer substantially covering sides of the stacked gate;
  removing the device separating insulation layer in a self-aligning manner by substantially using the stacked gate by means of selective etching; and
  forming the first high density impurity region in a self-aligning manner by substantially using the stacked gate in the semiconductor region selectively removing a part of the device separating insulation layer, wherein the first high density impurity region and the second high density impurity region are formed in a self-aligning manner by substantially using the stacked gate and un-etched device separating insulation layer in the semiconductor region including the semiconductor region where the device separating insulation layer is selectively removed, after carrying out the selective etching.

* * * * *